(12) United States Patent
Takahashi et al.

(10) Patent No.: US 10,802,080 B2
(45) Date of Patent: Oct. 13, 2020

(54) BATTERY SYSTEM IN VEHICLE AND AGING DETERIORATION ESTIMATION METHOD FOR BATTERY

(71) Applicant: TOYOTA JIDOSHA KABUSHIKI KAISHA, Toyota-shi, Aichi-ken (JP)

(72) Inventors: Kenji Takahashi, Toyota (JP); Kazushi Akamatsu, Anjyo (JP); Kiyohito Machida, Aichi-ken (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 239 days.

(21) Appl. No.: 15/963,579

(22) Filed: Apr. 26, 2018

(65) Prior Publication Data
US 2018/0313906 A1   Nov. 1, 2018

(30) Foreign Application Priority Data

Apr. 27, 2017   (JP) .................................. 2017-088148

(51) Int. Cl.
*G01N 27/416*   (2006.01)
*G01R 31/392*   (2019.01)
(Continued)

(52) U.S. Cl.
CPC ....... *G01R 31/392* (2019.01); *G01R 31/3648* (2013.01); *G01R 31/378* (2019.01);
(Continued)

(58) Field of Classification Search
CPC .. G01R 31/367; G01R 31/374; G01R 31/379; G01R 31/382; G01R 31/387;
(Continued)

(56) References Cited

U.S. PATENT DOCUMENTS 5,808,445 A * 9/1998 Aylor ................... G01R 31/379
                                                  320/132
6,850,038 B2 * 2/2005 Arai ....................... H01M 10/48
                                                  320/132
(Continued)

FOREIGN PATENT DOCUMENTS

CN          106030893 A     10/2016
EP          1 495 526 B1     2/2009
(Continued)

OTHER PUBLICATIONS

N. Somakettarin et al., "Study on Factors for Accurate Open Circuit Voltage Characterizations in Mn-Type Li-Ion Batteries", Batteries, Mar. 12, 2017, vol. 3, No. 4, XP055519128, pp. 1-13 (p. 8).

*Primary Examiner* — Thang X Le
(74) *Attorney, Agent, or Firm* — Sughrue Mion, PLLC

(57) ABSTRACT

A battery system includes: a battery; a voltage detector that detects a voltage of the battery as a detected voltage value; a current detector that detects a current flowing through the battery as a detected current value; and an electronic control unit. The electronic control unit is configured to estimate an aging deterioration of the battery based on an open circuit voltage value that is calculated from the detected voltage value and an integrated current value that is calculated from the detected current value, and estimate the aging deterioration of the battery based on the open circuit voltage value and the integrated current value that are calculated when a charge level of the battery is in the non-hysteresis region.

8 Claims, 21 Drawing Sheets

(51) Int. Cl.
*G01R 31/36* (2020.01)
*G01R 31/378* (2019.01)
*G01R 31/3842* (2019.01)
*G01R 31/382* (2019.01)
*G01R 31/3828* (2019.01)

(52) U.S. Cl.
CPC ....... *G01R 31/382* (2019.01); *G01R 31/3828* (2019.01); *G01R 31/3842* (2019.01)

(58) Field of Classification Search
CPC .......................... G01R 31/389; G01R 31/392; G01R 31/3842; G01R 31/3606; G01R 31/3624; G01R 31/3634; G01R 31/3648; G01R 31/3651; G01R 31/3662; G01R 31/3665; G01R 31/3675; G01R 31/3679
See application file for complete search history.

(56) References Cited

U.S. PATENT DOCUMENTS

| | | | |
|---|---|---|---|
| 7,573,237 B2* | 8/2009 | Cutrona | H02J 7/0047 320/132 |
| 9,500,713 B1 | 11/2016 | Ghantous et al. | |
| 9,685,807 B2* | 6/2017 | Nakao | G01R 31/3842 |
| 2005/0156566 A1 | 7/2005 | Thorsoe et al. | |
| 2007/0077490 A1 | 4/2007 | Kim et al. | |
| 2012/0200266 A1 | 8/2012 | Berkowitz et al. | |
| 2013/0099794 A1 | 4/2013 | Takahashi et al. | |
| 2013/0341923 A1 | 12/2013 | Ju et al. | |
| 2016/0099463 A1 | 4/2016 | Lee et al. | |
| 2016/0243957 A1 | 8/2016 | Boehm et al. | |
| 2016/0318417 A1 | 11/2016 | Suzuki | |
| 2017/0010327 A1* | 1/2017 | Nishiguchi | G01R 31/367 |
| 2017/0146609 A1* | 5/2017 | Uchino | G01R 31/367 |

FOREIGN PATENT DOCUMENTS

| | | |
|---|---|---|
| JP | 2004257781 A | 9/2004 |
| JP | 5537236 B2 | 7/2014 |
| JP | 2015-121444 A | 7/2015 |
| JP | 2016-167394 A | 9/2016 |
| KR | 1020070034254 A | 3/2007 |
| KR | 1020140003325 A | 1/2014 |
| KR | 1020160040046 A | 4/2016 |
| WO | 2015/092521 A1 | 6/2015 |

* cited by examiner

BATTERY SYSTEM IN VEHICLE AND AGING DETERIORATION ESTIMATION METHOD FOR BATTERY

INCORPORATION BY REFERENCE

The disclosure of Japanese Patent Application No. 2017-088148 filed on Apr. 27, 2017 including the specification, drawings and abstract is incorporated herein by reference in its entirety.

BACKGROUND

1. Technical Field

The present specification discloses a battery system that is equipped in a vehicle, that includes a battery capable of being charged and discharged, and that has a function to estimate the aging deterioration of the battery, and an aging deterioration estimation method for a battery.

2. Description of Related Art

There is widely known an electrically driven vehicle that is equipped with a rotating electric machine as a driving source. Such an electrically driven vehicle is equipped with a battery system including a secondary battery that can be charged and discharged. The secondary battery supplies electric power to the rotating electric machine when the rotating electric machine is driven as an electric motor, and stores electric power generated when the rotating electric machine is driven as an electric generator. The battery system controls charge and discharge of the secondary battery such that the charge level of the secondary battery, that is, the so-called state-of-charge (SOC) does not exceed a prescribed upper limit (which is sufficiently lower than 100%) and does not fall below a prescribed lower limit (which is sufficiently higher than 0%). For performing such a control, in the battery system, it is desirable to exactly estimate the charge level of the secondary battery.

Generally, the charge level of the secondary battery is calculated by referring to a previously stored SOC-OCV curve, the full charge capacity of the secondary battery, or the like. The OCV is an abbreviation for Open Circuit Voltage, and means an open circuit voltage. The SOC-OCV curve is a curve indicating the open circuit voltage value (OCV) of the secondary battery with respect to the charge level. For example, when the open circuit voltage value of the secondary battery can be acquired, the battery system estimates the charge level at the current time, by checking the open circuit voltage value against the SOC-OCV curve. As another type, the battery system calculates the integrated value of current that is input to and output from the secondary battery, and estimates the change amount of the charge level and further the charge level at the current time based on comparison between the integrated current value and the full charge capacity.

Since the charge level of the secondary battery is estimated by referring to the SOC-OCV curve or the full charge capacity in this way, it is desirable that the stored SOC-OCV curve or full charge capacity exactly indicate the state of the secondary battery at the current time, for exactly estimating the charge level. However, the full charge capacity of the secondary battery and the change characteristic of the open circuit voltage with respect to the charge level gradually change with the aging deterioration of the secondary battery. Accordingly, for exactly estimating the charge level, it is desirable to estimate the aging deterioration of the secondary battery and modify the SOC-OCV curve and the full charge capacity depending on the estimation result, when appropriate.

For estimating the aging deterioration of the secondary battery, conventionally, various technologies have been proposed. For example, Japanese Patent Application Publication No. 2015-121444 (JP 2015-121444 A) discloses a technology in which the full charge capacity is estimated based on the open circuit voltage value and the integrated current value. Specifically, in JP 2015-121444 A, the open circuit voltage value is detected twice in the middle of the charge of the secondary battery, and the integrated current value between the detections is acquired. Then, in the disclosed technology, the SOCs at the time of the detections are evaluated as a first SOC and a second SOC, based on the open circuit voltage value, and a value resulting from dividing the integrated current value by a difference value between the first SOC and the second SOC is calculated as the full charge capacity.

Japanese Patent No. 5537236 discloses a technology in which three deterioration parameters indicating an open circuit voltage characteristic that is a change characteristic of the open circuit voltage with respect to the full charge capacity of the secondary battery is evaluated in a searching manner. Specifically, in Japanese Patent No. 5537236, a measured value of the open circuit voltage characteristic is acquired by measuring the open circuit voltage value of the secondary battery and the integrated current value, and three deterioration parameters matching the measured open circuit voltage characteristic are searched.

SUMMARY

As described above, in most of the related art, the aging deterioration of the secondary battery is estimated from the relationship between the actually measured open circuit voltage value and integrated current value. Incidentally, some secondary batteries have a significant hysteresis in which there is a certain amount or more of difference in the open circuit voltage value with respect to the charge level between a time after a continuous charge and a time after a continuous discharge, in a partial charge level range. For example, in the case of a lithium ion secondary battery having a negative electrode active material that contains a silicon material (for example, Si or SiO) and graphite, it is known that there is a difference between an open circuit voltage value after a continuous charge and an open circuit voltage value after a continuous discharge, even at the same SOC, in a low-SOC region. As described above, in the estimation of the aging deterioration, the measured value of the open circuit voltage value is used, and when the open circuit voltage value is acquired in a charge level range in which the significant hysteresis appears, it is difficult to uniquely identify the aging deterioration from the open circuit voltage value.

Hence, the present specification discloses a battery system and an aging deterioration estimation method for a battery that make it possible to estimate the aging deterioration easily and exactly even in the case of the battery in which the significant hysteresis appears in a partial charge level range.

As an example aspect of the present disclosure is a battery system that is equipped in a vehicle. The battery system includes: a battery configured to be charged and discharged, the battery being equipped in the vehicle, a charge level range of the battery including a hysteresis region and a non-hysteresis region, the hysteresis region being a charge level range of the battery where a significant hysteresis occurs, the significant hysteresis being hysteresis in which open-circuit voltage values with respect to a charge level of the battery after continuation of charging and after continuation of discharging are different from each other by a predetermined value or more, the non-hysteresis region being a charge level range of charge of the battery where the significant hysteresis does not occur; a voltage detector configured to detect a voltage of the battery as a detected voltage value; a current detector configured to detect a current flowing through the battery as a detected current value; and an electronic control unit configured to control charge and discharge of the battery. The electronic control unit is configured to estimate an aging deterioration of the battery based on an open circuit voltage value that is calculated from the detected voltage value and an integrated current value that is calculated from the detected current value. The electronic control unit is configured to estimate the aging deterioration of the battery based on the open circuit voltage value and the integrated current value that are calculated when the charge level of the battery is in the non-hysteresis region.

In the battery system, the open circuit voltage value and the integrated current value that are used for the estimation of the aging deterioration of the battery are acquired when the charge level is in the non-hysteresis region. Therefore, it is possible to estimate the aging deterioration with no influence of the significant hysteresis. As a result, it is possible to estimate the aging deterioration easily and exactly.

The open circuit voltage value may include a first open circuit voltage value and a second open circuit voltage value that are acquired in the non-hysteresis region, the integrated current value may be a value resulting from integrating the detected current value until the open circuit voltage value changes to the second open circuit voltage value after the open circuit voltage value becomes the first open circuit voltage value, and the electronic control unit may be configured to estimate, as a characteristic indicating the aging deterioration, at least one of a full charge capacity of the battery at a current time and a change characteristic of the open circuit voltage value with respect to the charge level, based on the first open circuit voltage value, the second open circuit voltage value and the integrated current value.

The full charge capacity of the battery and the change characteristic of the open circuit voltage value with respect to the charge level are used for the estimation of the charge level of the battery. By estimating the values that are used for the estimation of the charge level, it is possible to accurately estimate the charge level of the battery.

The battery system may further include a charger configured to charge the battery while the vehicle is at a standstill. The electronic control unit may be configured to temporarily stop charge of the battery with the charger when the charge level of the battery reaches a first charge level or a second charge level in the non-hysteresis region in a middle of the charge of the battery with the charger, and acquire the detected voltage value that is obtained during a charge stop period, as one of the first open circuit voltage value and the second open circuit voltage value.

By adopting such a configuration, it is possible to surely acquire the open circuit voltage value and the integrated current value that are used for the estimation of the aging deterioration of the battery.

The electronic control unit may be configured to acquire two open circuit voltage values that are acquired at timings when the charge level of the battery is in the non-hysteresis region and the open circuit voltage values are acquirable, as the first open circuit voltage value and the second open circuit voltage value, during a power-on of the vehicle.

By adopting such a configuration, it is possible to acquire the open circuit voltage value and the integrated current value that are used for the estimation of the aging deterioration of the battery, even during the power-on of the vehicle.

The electronic control unit may be configured to control the charge and discharge of the battery such that the charge level of the battery transitions to the non-hysteresis region, and acquire the first open circuit voltage value, the second open circuit voltage value and the integrated current value, when an elapsed time from a last estimation of the aging deterioration is equal to or more than a prescribed reference time.

By adopting such a configuration, it is possible to surely acquire the open circuit voltage value and the integrated current value that are used for the estimation of the aging deterioration of the battery.

The electronic control unit may be configured to: estimate at least a change characteristic of the open circuit voltage value with respect to the charge level, as a characteristic indicating the aging deterioration; estimate the charge level range that is the non-hysteresis region, based on the estimated change characteristic of the open circuit voltage value with respect to the charge level; and update the non-hysteresis region based on the estimated charge level range.

By adopting such a configuration, it is possible to constantly obtain the non-hysteresis region corresponding to the state of the battery at the current time.

The electronic control unit may be configured to update the charge level at a time of acquisition of the open circuit voltage value and the integrated current value that are used for one of the estimation of the aging deterioration and a range of the charge level, along with the update of the non-hysteresis region.

By adopting such a configuration, it is possible to acquire the open circuit voltage value and the integrated current value that are used for the estimation of the aging deterioration of the battery, at a more suitable timing, it is possible to further enhance an estimation property for the aging deterioration, and it is possible to obtain an opportunity of the estimation of the aging deterioration more surely.

The battery may be a lithium ion secondary battery having a negative electrode active material that contains at least a silicon material and graphite, and the charge level range of the non-hysteresis region may be higher in the charge level than a charge level range of the hysteresis region.

By using such a battery, it is possible to increase the capacity.

The battery may be a lithium ion secondary battery having a negative electrode active material that contains at least a silicon material and lithium titanate, and the charge level range of the non-hysteresis region may be higher in the charge level than a charge level range of a hysteresis region.

As an example aspect of the present disclosure is an aging deterioration estimation method for a battery system. A charge level of the battery includes a hysteresis region and a non-hysteresis region, the hysteresis region being a range of the state of charge of the battery where a significant hysteresis occurs, the significant hysteresis being hysteresis in which open-circuit voltage values with respect to a charge level of charge of the battery after continuation of charging and after continuation of discharging are different from each other by a predetermined value or more, the non-hysteresis region being a charge level of the battery where the significant hysteresis does not occur. The battery system includes an electronic control unit. The aging deterioration estimation method includes: acquiring, by the electronic control unit, parameters from which open circuit voltage values at two points and an integrated current value between the two points are calculated when the charge level of the battery is in the non-hysteresis region; and estimating, by the electronic control unit, an aging deterioration of the battery based on the acquired open circuit voltage values and the acquired integrated current value.

In the aging deterioration estimation method, the open circuit voltage value and the integrated current value that are used for the estimation of the aging deterioration of the battery are acquired when the charge level is in the non-hysteresis region. Therefore, it is possible to estimate the aging deterioration with no influence of the significant hysteresis. As a result, it is possible to estimate the aging deterioration easily and exactly.

In the battery system and the aging deterioration estimation method for the battery that are disclosed in the present specification, the open circuit voltage value and the integrated current value that are used for the estimation of the aging deterioration of the battery are acquired when the charge level is in the non-hysteresis region. Therefore, it is possible to estimate the aging deterioration with no influence of the significant hysteresis. As a result, it is possible to estimate the aging deterioration easily and exactly.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Hereinafter, the configuration of a battery system 10 will be described with reference to the drawings.

Figure 1:
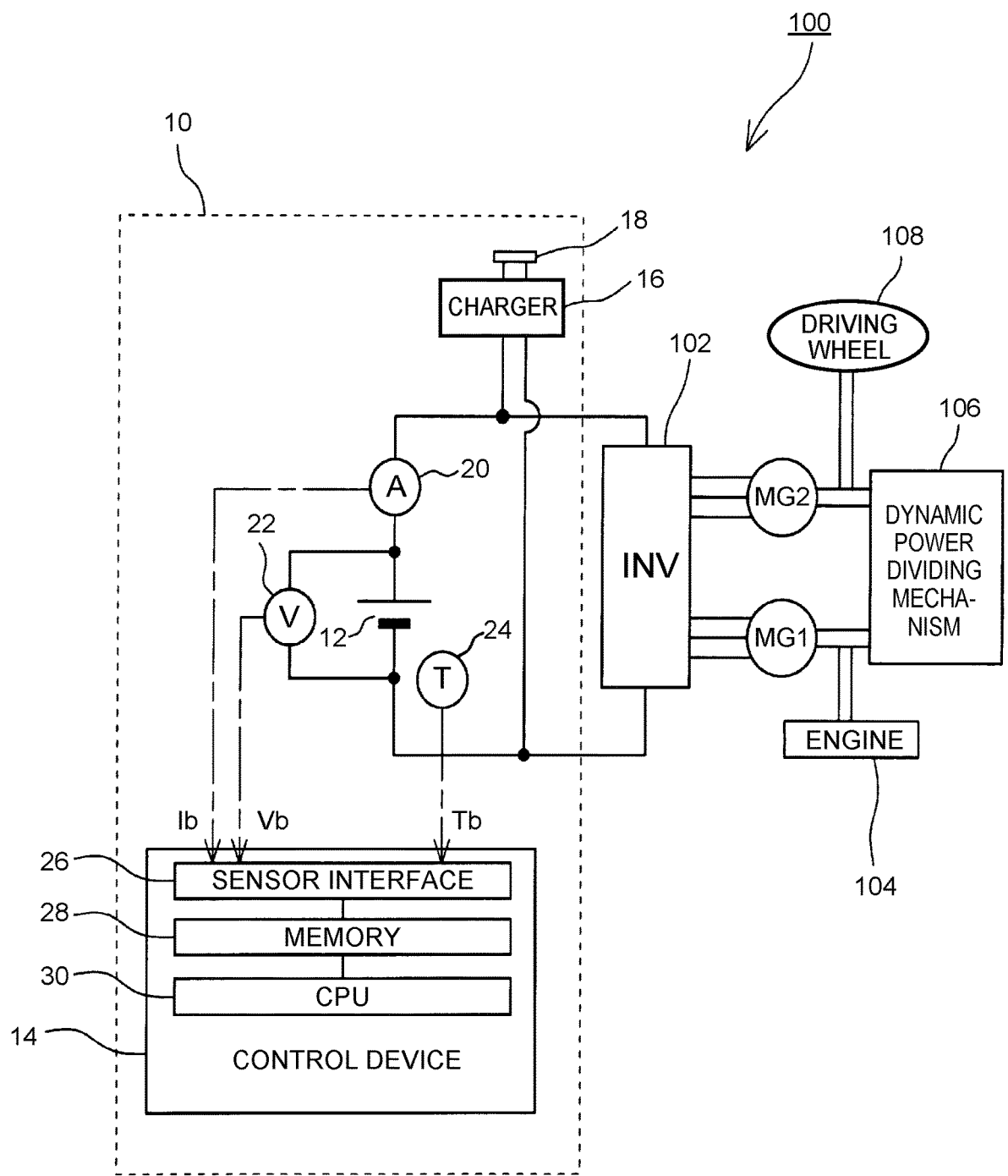
FIG. 1 is a diagram showing a configuration of an electrically driven vehicle equipped with a battery system.

FIG. 1 is a diagram showing a schematic configuration of an electrically driven vehicle 100 equipped with the battery system 10. The electrically driven vehicle 100 is a hybrid vehicle including two rotating electric machines MG1, MG2 and one engine 104 as dynamic power sources. The battery system 10 disclosed in the present specification may be equipped in another type of electrically driven vehicle. For example, the battery system 10 may be equipped in an electric vehicle including only a rotating electric machine as a dynamic power source.

The engine 104 is connected to a dynamic power dividing mechanism 106 including a planetary gear and the like. The planetary gear divides and transmits dynamic power of the engine 104 to a driving wheel 108 and the first rotating electric machine MG1. Each of the two rotating electric machine MG1, MG2 functions as an electric motor, and further, functions as an electric generator. An output shaft of the second rotating electric machine MG2 is linked to the driving wheel 108. The second rotating electric machine MG2 functions mainly as an electric motor, and supplies driving torque to the driving wheel 108 when the vehicle travels. When the vehicle brakes, the second rotating electric machine MG2 functions as an electric generator that generates electricity using braking power. The first rotating electric machine MG1 functions mainly as an electric generator. The first rotating electric machine MG1, which is linked to the dynamic power dividing mechanism 106, receives surplus dynamic power of the engine 104 and generates electricity. The first rotating electric motor MG1 functions also as a starter motor that starts the engine 104. Since the electrically driven vehicle 100 disclosed in the present specification includes the engine 104 in this way, the electrically driven vehicle 100 can charge a battery 12 using the surplus dynamic power of the engine 104, even while the vehicle is traveling. Further, a fuel cell or the like may be equipped instead of the engine.

An inverter 102 converts direct-current power into alternating-current power, and coverts alternating-current power into direct-current power. Specifically, the inverter 102 converts direct-current power supplied from the battery 12 described later, into alternating-current power, and outputs the alternating-current power to the first and second rotating electric machines MG1, MG2 that are driven as electric motors. Further, the inverter 102 converts alternating-current power generated by the first and second rotating electric machines MG1, MG2 that are driven as electric generators, into direct-current power, and supplies the direct-current power to the battery 12. Between the inverter 102 and the battery 12, a transformer to step up or step down electric power may be provided. Drives of the inverter 102, the rotating electric machine MG1, MG2, the engine 104 and the like are controlled by a control device 14.

The battery system 10 includes the battery 12 that can be charged and discharged. The battery 12 is a secondary battery that supplies electric power for driving the rotating electric machines MG1, MG2 and that stores electric power generated by the rotating electric machines MG1, MG2. The battery 12 includes a plurality of electric cells connected in series or in parallel. As the kind of the battery 12, various kinds are possible. In the embodiment, a lithium ion secondary battery in which a complex containing a silicon material and graphite is used as a negative electrode active material is used. In the case where a complex containing a silicon material and graphite is used as the negative electrode active material, the battery 12 partially has a significant hysteresis in a change characteristic of an open circuit voltage value Vo with respect to a charge level Cb. This will be described later. The charge level Cb is a value (%) from multiplying the ratio of a charge capacity at the current time to a full charge capacity FCC of the battery 12 by 100%, and is a value that is generally called a state-of-charge (SOC).

The battery system 10 is provided with a current sensor 20, a voltage sensor 22, a temperature sensor 24 and the like, for identifying the state of the battery 12. The current sensor (current detector) 20 detects a current value that is input to or output from the battery 12. The current value detected is input to the control device 14, as a detected current value Ib. The voltage sensor (voltage detector) 22 detects a voltage value between terminals of the battery 12. The voltage value detected is input to the control device (electronic control unit) 14, as a detected voltage value Vb. Typically, the battery 12 is an assembled battery having a plurality of cells connected in series or in parallel. Therefore, the voltage sensor 22 may be provided for each cell, or may be provided for each block constituted by a plurality of cells. Only one voltage sensor 22 may be provided for the whole of the assembled battery. The temperature sensor 24 detects the temperature of the battery 12. The temperature detected is input to the control device 14, as a battery temperature Tb. One temperature sensor 24 may be provided, or a plurality of temperature sensors 24 may be provided. In the case where a plurality of voltage sensors 22 or temperature sensors 24 is provided, a statistical value of detected values of the plurality of voltage sensors 22 or temperature sensors 24, for example, average value, maximum value, minimum value or the like may be treated as the detected voltage value Vb or the battery temperature Tb.

The battery system 10 further includes a charger 16 and a connector 18 for external charge of the battery 12. The external charge is a charge of the battery 12 with electric power from an external power source (for example, a commercial power source) provided in the exterior of the electrically driven vehicle 100. The connector 18 can be connected to a connector (a so-called charge plug) of the external power source. The charger 16 converts external electric power (alternating-current power) supplied through the connector 18, into direct-current power, and supplies the direct-current power to the battery 12. The battery system 10 may include a charge mechanism other than the mechanism for the external charge, as long as the battery 12 can be charged while the vehicle 100 is at a standstill. For example, the battery system 10 may include a solar panel and the like that generate electricity using solar light, instead of or in addition to the charger 16 and the like for the external charge. For some situations, the battery system 10 does not need include the charge mechanism for charging the battery 12 while the vehicle 100 is at a standstill.

The control device 14 controls drives of driving sources such as the rotating electric machines MG1, MG2, the engine 104 and the like, and controls charge and discharge of the battery 12. The control device 14 includes a sensor interface 26, a memory 28, a CPU 30 and the like. The sensor interface 26 is connected with the respective sensors 20, 22, 24. The sensor interface 26 outputs control signals to the respective sensors 20, 22, 24, and converts data input from the respective sensors 20, 22, 24, into a signal format allowing for processing by the CPU 30. The memory 28 stores various control parameters and various programs. The CPU 30 performs various information processes and computations. The sensor interface 26, the CPU 30 and the memory 28 are connected with each other through a data bus 44. In FIG. 1, the control device 14 is illustrated as one block, but the control device 14 may be constituted by a plurality of devices (a plurality of CPUs 30, a plurality of memories 28, and the like). Some functions of the control device 14 may be realized by an external device that is provided in the exterior of the vehicle and that can wirelessly communicate with the control device provided in the vehicle.

The control device 14 controls the charge and discharge of the battery 12 such that a charge level Cb of the battery 12 does not go beyond a prescribed upper limit and lower limit. For such a control, the control device 14 periodically estimates and monitors the charge level Cb of the battery 12. The control device 14 estimates the charge level Cb from an open circuit voltage value Vo of the battery 12 or from an integrated current value ΔAh. The integrated current value ΔAh is an integrated value of current that is input to or output from the battery 12, and is typically evaluated by ΔAh=Σ(Ib×Δt)/3600 when a sampling period for the detected current value Ib is Δt. Here, when the battery is used such that the charge is greater, ΔAh is a value that increases the battery capacity (increases SOC). When the battery is used such that the discharge is greater, ΔAh is a value that decreases the battery capacity (decreases SOC).

Figure 2:
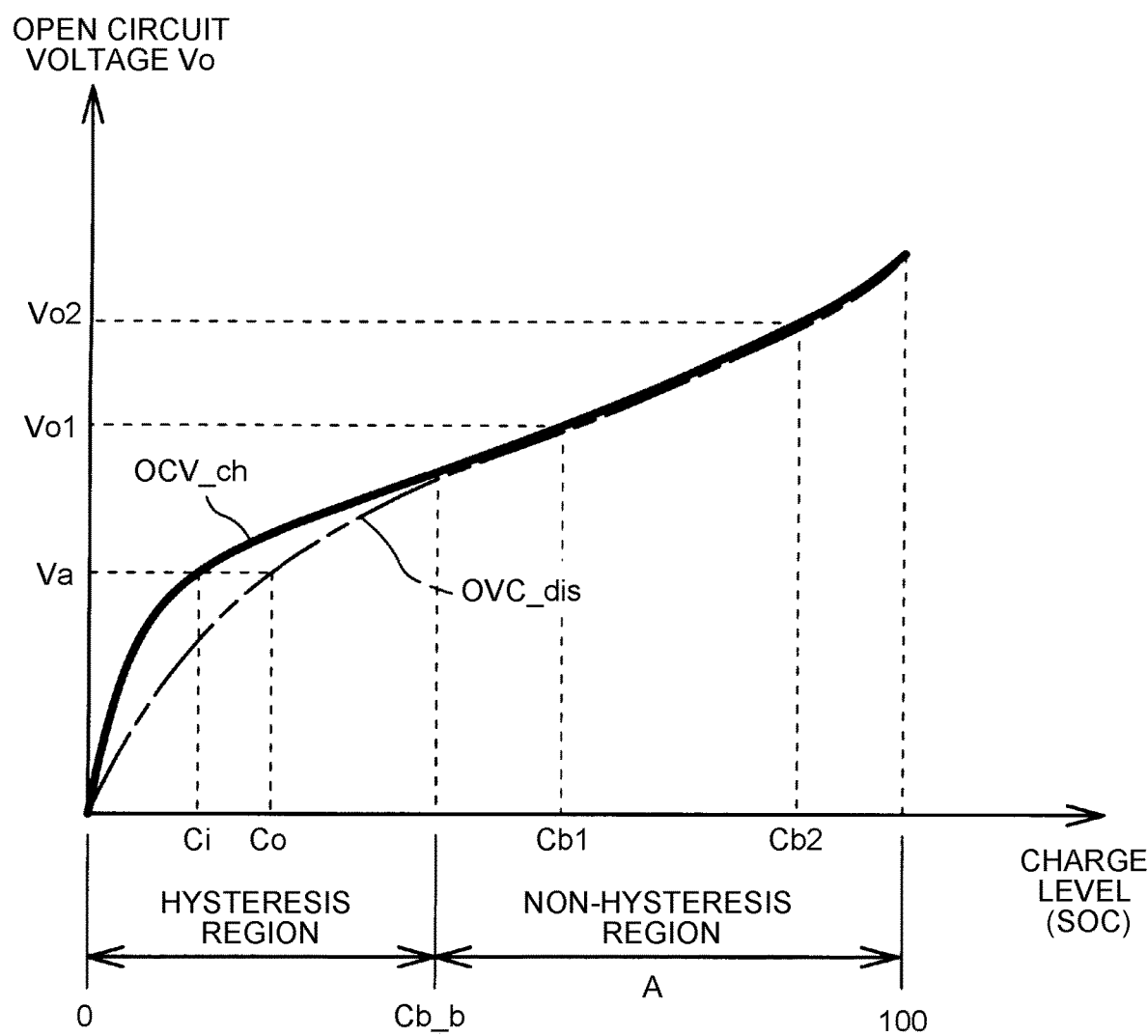
FIG. 2 is a diagram showing an example of an SOC-OCV curve.

The estimation of the charge level Cb will be specifically described. In the memory 28, the full charge capacity FCC of the battery 12 and an SOC-OCV curve are stored. The SOC-OCV curve is a curve indicating a change in the open circuit voltage value Vo with respect to the charge level Cb of the battery 12. FIG. 2 shows an example of the SOC-OCV curve. The control device 14 estimates the charge level Cb, by checking the open circuit voltage value Vo of the battery 12 against the SOC-OCV curve. The open circuit voltage value Vo is a voltage between the terminals of the battery 12 in a state where the battery 12 is not polarized (in a relaxation state). The open circuit voltage value Vo that is used for various computations may be a measured value or may be an estimated value. Accordingly, when the charge and discharge of the battery 12 is stopped for a certain time period and the polarization is eliminated, the detected voltage value Vb detected by the voltage sensor 22 may be treated as the open circuit voltage value Vo. Further, even during the polarization, if the current flowing through the battery 12 is very low and a polarization component can be accurately estimated, a value resulting from correcting the detected voltage value Vb detected by the voltage sensor 22 in consideration of an influence of the polarization may be treated as the open circuit voltage value Vo.

As another method, the control device 14 estimates the charge level Cb at the current time, by calculating a change amount ΔCb of the charge level Cb from the integrated current value ΔAh and adding the change amount ΔCb to the charge level Cb at the last time. The change amount ΔCb of the charge level Cb is the ratio of the integrated current value ΔAh to the full charge capacity FCC, and is obtained by the computation of ΔCb=(ΔAh/FCC)×100.

As is obvious from the above description, in the estimation of the charge level Cb, the control device 14 refers to the SOC-OCV curve or the full charge capacity FCC. Accordingly, for exactly estimating the charge level Cb at the current time, the SOC-OCV curve or full charge capacity FCC stored in the memory 28 needs to exactly reflect the state of the battery 12 at the current time. The SOC-OCV curve or the full charge capacity FCC gradually changes with the aging deterioration of the battery 12. Therefore, for exactly estimating the charge level Cb at the current time, it is desirable to estimate the aging deterioration of the battery 12 as needed, and to modify and update the SOC-OCV curve or full charge capacity FCC stored in the memory 28 as needed. Hence, the control device 14 estimates the aging deterioration of the battery 12 as needed. In the following, an aging deterioration estimation for the battery 12 will be described in detail.

Typically, the aging deterioration of the battery 12 is estimated based on the open circuit voltage values Vo at a plurality of points away from each other and the integrated current value ΔAh among the plurality of points. As described above, for the battery 12 in the embodiment, the SOC-OCV curve partially has a significant hysteresis. This will be described with reference to FIG. 2. FIG. 2 is a diagram showing an example of the SOC-OCV curve of the battery 12. In FIG. 2, the abscissa axis indicates the charge level Cb (SOC), and the ordinate axis indicates the open circuit voltage value Vo. Furthermore, in FIG. 2, the solid line is an SOC-OCV curve that is obtained in the process in which the battery 12 is charged after the full discharge of the battery 12. In other words, the solid line is an SOC-OCV curve after a continuous charge. Hereinafter, this curve is referred to as a "charge OCV" or "OCV_ch". The alternate long and short dash line is an SOC-OCV curve that is obtained in the process in which the battery 12 is discharged after the full charge of the battery 12. In other words, the alternate long and short dash line is an SOC-OCV curve after a continuous discharge. Hereinafter, this curve is referred to as a "discharge OCV" or "OCV_dis".

As is obvious from FIG. 2, in a high-SOC region in which the charge level Cb is relatively high, there is little difference between OCV_ch and OCV_dis and there is no significant hysteresis in the region. On the other hand, in a low-SOC region in which the charge level Cb is relatively low, there is a certain amount or more of difference between OCV_dis and OCV_ch, and there is a significant hysteresis. Hereinafter, the region in which the significant hysteresis does not appear is referred to as a "non-hysteresis region". Further, the region in which the significant hysteresis appears is referred to as a "hysteresis region". Furthermore, the charge level at the border between the non-hysteresis region and the hysteresis region is referred to as a border charge level Cb_b. When Vch[n] is a voltage indicated by OCV_ch in the case of the charge level Cb=n, Vdis[n] is a voltage indicated by OCV_dis in the case of the charge level Cb=n and ΔVdef is a prescribed threshold, the non-hysteresis region is a region that satisfies (|Vch[n]−Vdis[n]|<ΔVdef), and the hysteresis region is a region that satisfies (|Vch[n]−Vdis[n]|≥ΔVdef).

In the non-hysteresis region, it can be thought that a charge level Cb after the continuous discharge and a charge level Cb after the continuous charge are equivalent in the case of an identical open circuit voltage value Vo. In other words, it can be said that the open circuit voltage value Vo obtained in the non-hysteresis region uniquely indicates the state of the battery 12. On the other hand, in the hysteresis region, a charge level Cb after the continuous discharge and a charge level Cb after the continuous charge are different even in the case of an identical open circuit voltage value Vo. For example, in the case of the open circuit voltage value Vo=Va, the charge level Cb after the continuous discharge is Co, and the charge level Cb after the continuous charge is Ci. Further, in the case where the charge and the discharge are alternately repeated, the charge level Cb sometimes has a value between Co and Ci even in the case of the open circuit voltage value Vo=Va. Accordingly, the open circuit voltage value Vo obtained in the hysteresis region cannot uniquely indicate the state of the battery 12.

In the case of using the open circuit voltage value Vo that cannot uniquely indicate the state of the battery 12 in this way, it is difficult to uniquely estimate the aging deterioration of the battery 12. Hence, for solving this problem, the battery system 10 disclosed in the specification estimates the deterioration by using only the open circuit voltage value Vo and integrated current value ΔAh acquired in the non-hysteresis region, in order to estimate the aging deterioration easily and exactly.

Figure 3:
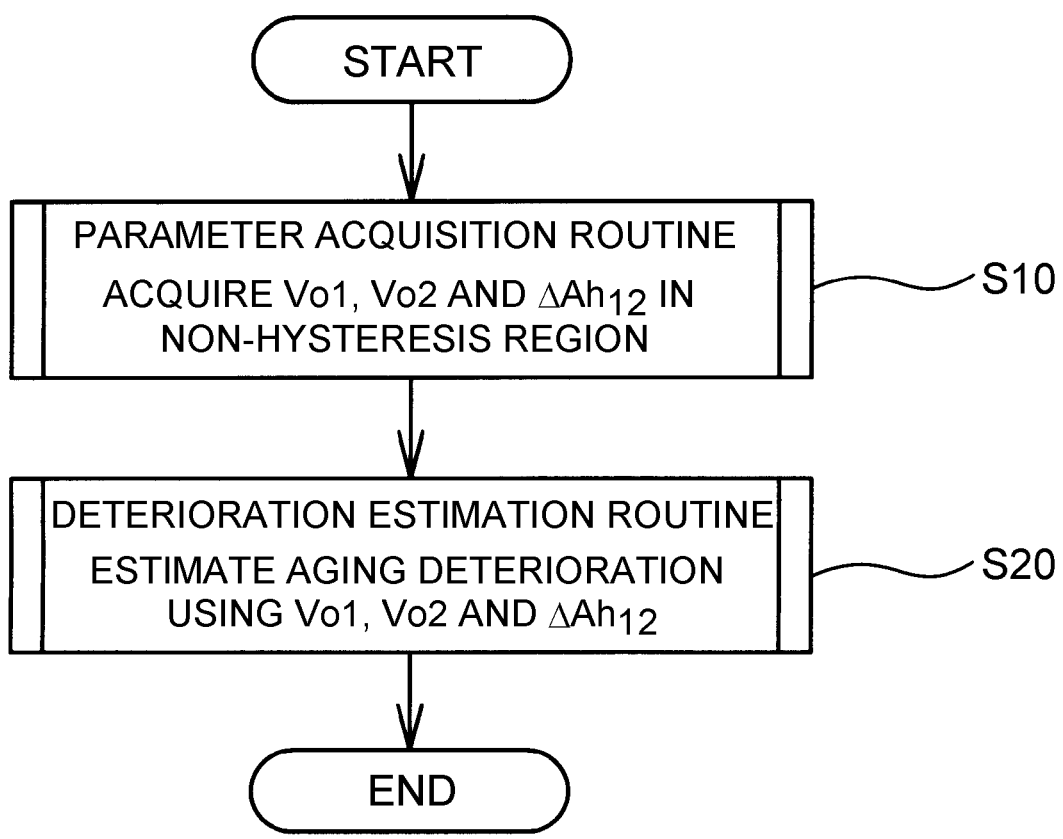
FIG. 3 is a flowchart showing an example of an aging deterioration estimation process for a battery.

FIG. 3 is a flowchart showing the most basic flow of an aging deterioration estimation process for the battery 12. The control device 14 estimates the aging deterioration by executing the flowchart shown in FIG. 3 periodically or at particular timings.

The aging deterioration estimation process is roughly divided into a parameter acquisition routine (S10) and a deterioration estimation routine (S20). In the parameter acquisition routine, the control device 14, in the non-hysteresis region, acquires a first open circuit voltage value Vo1, a second open circuit voltage value Vo2, and an integrated current value $\Delta Ah_{12}$ resulting from integrating the detected current value Ib until the open circuit voltage value Vo changes to the second open circuit voltage value Vo2 after the open circuit voltage value Vo becomes the first open circuit voltage value Vo1. The first open circuit voltage value Vo1 and the second open circuit voltage value Vo2 are not particularly limited as long as the first open circuit voltage value Vo1 and the second open circuit voltage value Vo2 are open circuit voltage values Vo acquired when the charge level Cb is in the non-hysteresis region (Cb_≤b≤Cb≤100). However, in view of the accuracy of the deterioration estimation of the battery 12, it is preferable that the first open circuit voltage value Vo1 and the second open circuit voltage value Vo2 deviate from each other in some degree. In any case, it can be said that the first and second open circuit voltage values Vo1, Vo2 and integrated current value $\Delta Ah_{12}$ acquired in the non-hysteresis region are parameters that uniquely indicate the state of the battery 12 at the current time.

In the deterioration estimation routine (S20), the control device 14 estimates the aging deterioration of the battery 12, using the parameters acquired in the parameter acquisition routine (S10). Specifically, the control device 14 estimates at least one of the full charge capacity FCC of the battery 12 at the current time and the SOC-OCV curve, using the acquired parameters. As the estimation method, various methods are possible. This will be described later in detail. In any estimation method, by using the parameters acquired in the non-hysteresis region, it is possible to exactly estimate the state of the battery 12 at the current time, with no influence of the hysteresis.

Figure 4A:
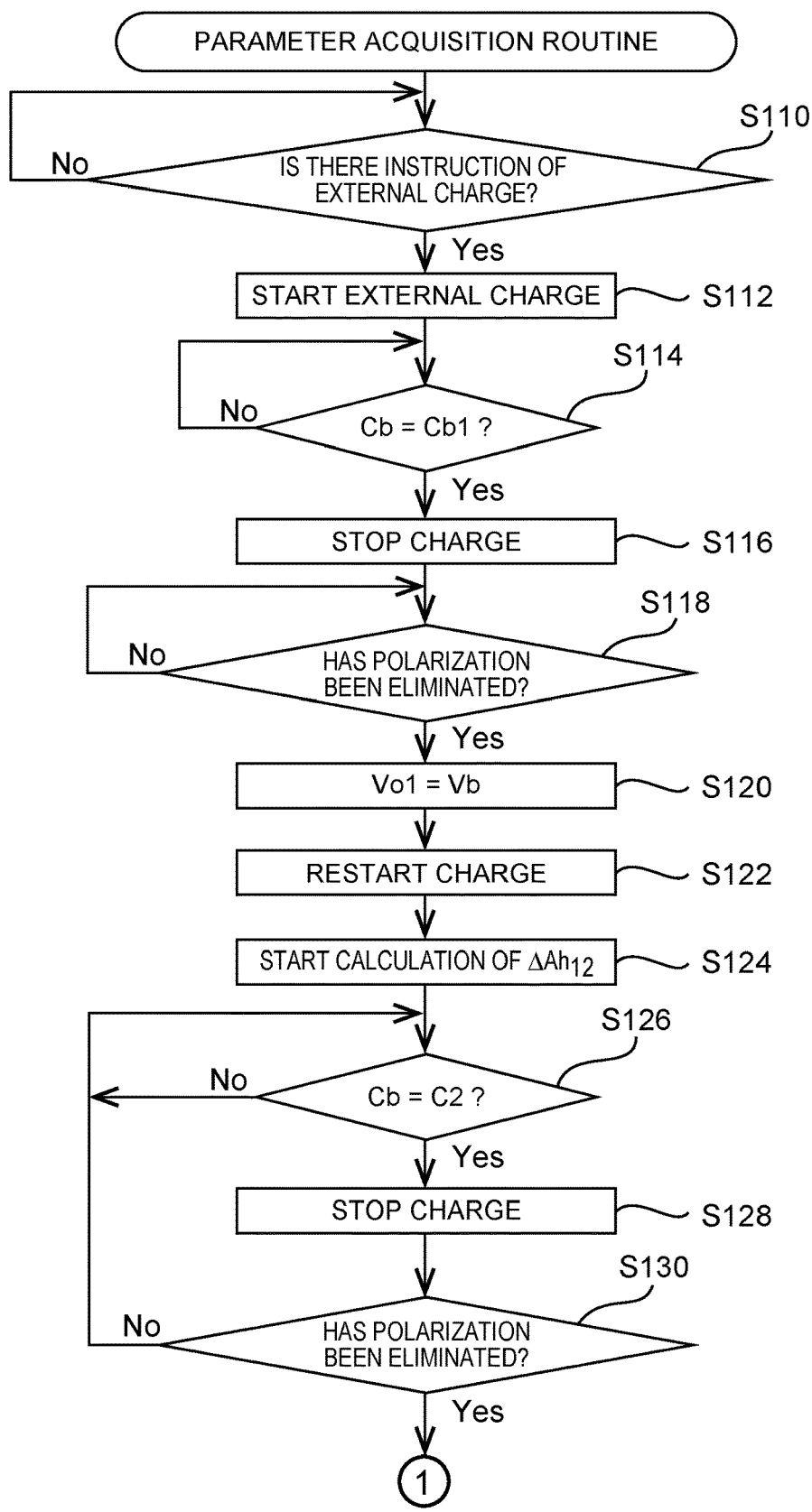
FIG. 4A is a flowchart showing a part of an example of a parameter acquisition routine.
Figure 4B:
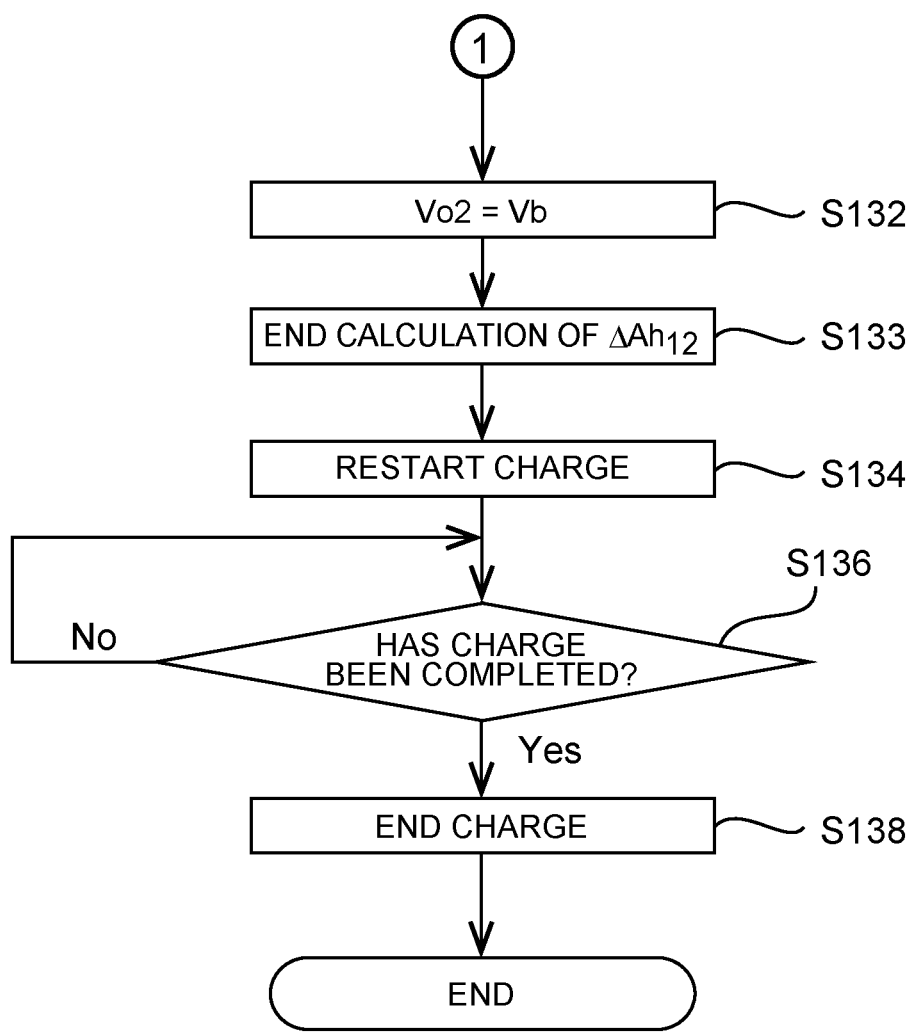
FIG. 4B is a flowchart showing a part of the example of a parameter acquisition routine.

Next, a specific example of the parameter acquisition routine will be described. FIGS. 4A and 4B is a flowchart showing an example of the parameter acquisition routine. In the example illustrated in FIGS. 4A and 4B, the first and second open circuit voltage values Vo1, Vo2 and the integrated current value $\Delta Ah_{12}$ are acquired at the timing of the external charge of the battery 12. In the example illustrated in FIGS. 4A and 4B, for acquiring the parameters, a first charge level Cb1 and a second charge level Cb2 are previously stored in the memory 28.

The first charge level Cb1 and the second charge level Cb2 each are values in the non-hysteresis region, and values that sufficiently deviate from each other (see FIG. 2). The first and second charge levels Cb1, Cb2 may be fixed values, or may be variable values. Here, the non-hysteresis region and the border charge level Cb_b change with the aging deterioration of the battery 12. Accordingly, in the case where the first and second charge levels Cb1, Cb2 are fixed values, the first and second charge levels Cb1, Cb2 are set to values that are kept in the non-hysteresis region even when the non-hysteresis region increases or decreases with the aging deterioration of the battery 12. In the case where the first and second charge levels Cb1, Cb2 are variable values, the first and second charge levels Cb1, Cb2 may be varied in conjunction with the increase or decrease in the non-hysteresis region associated with the aging deterioration of the battery 12.

In the example illustrated in FIGS. 4A and 4B, as already described, in the parameter acquisition routine, the control device 14 acquires the parameters at the timing of the external charge, and therefore, monitors whether there is an instruction of the external charge (S110). When there is an instruction of the external charge, the control device 14 starts the external charge (S112).

During the execution of the external charge, the control device 14 checks whether the charge level Cb has reached the first charge level Cb1 stored in the memory 28 (S114). Here, the charge level Cb at the current time is estimated from the open circuit value Vo or the integrated current value $\Delta Ah$. During the execution of the external charge, the detected voltage value Vb includes the polarization component, and therefore, it is necessary to estimate the open circuit voltage value Vo by subtracting the polarization component from the detected voltage value Vb. However, the low-SOC region (hysteresis region) has an influence of the hysteresis. Accordingly, it is difficult to uniquely identify the charge level Cb from the open circuit voltage value Vo, without considering a history of past charges and discharges. Therefore, in the hysteresis region, it is preferable to estimate the charge level Cb with a predetermined period, mainly from the integrated current value $\Delta Ah$, both during the external charge and during the traveling.

When the charge level Cb has reached the first charge level Cb1, the control device 14 stops the external charge (S116). During the stop period, the control device 14 checks whether the polarization has been eliminated, with a predetermined period (S118). When the result of the check shows that the polarization has been eliminated, the control device 14 measures the detected voltage value Vb at the time point, as the first open circuit voltage value Vo1 (S120).

After the acquisition of the first open circuit voltage value Vo1, the control device 14 restarts the external charge (S122). Further, the control device 14 starts the calculation of the integrated current value $\Delta Ah_{12}$ (S124). The control device 14 performs the external charge until the charge level Cb reaches the second charge level Cb2 stored in the memory 28 (until the determination of Yes is made in S126). When the charge level Cb has reached the second charge level Cb2, the control device 14 stops the charge, and waits until the polarization is eliminated (S128). When the polarization has been eliminated (Yes in S130), the control device 14 measures the detected voltage value Vb at the time point, as the second open circuit voltage value Vo2 (S132). Further, the control device 14 acquires the integrated current value $\Delta Ah_{12}$ from the measurement of the first open circuit voltage value Vo1 to the measurement of the second open circuit voltage value Vo2 (S124, S133).

After the acquisition of the second open circuit voltage value Vo2, the control device 14 restarts the external charge (S134). Then, when the charge level Cb has reached a predetermined target charge level (for example, 90%), the control device 14 determines that the charge has been completed (S136), and ends the external charge (S138). Thereby, the parameter acquisition routine is ended. Here, when the target charge level is in the non-hysteresis region, the target charge level may be set as the second charge level Cb2. In this case, since the charge is ended in step S133, step S134 and step S136 are unnecessary.

Figure 5:
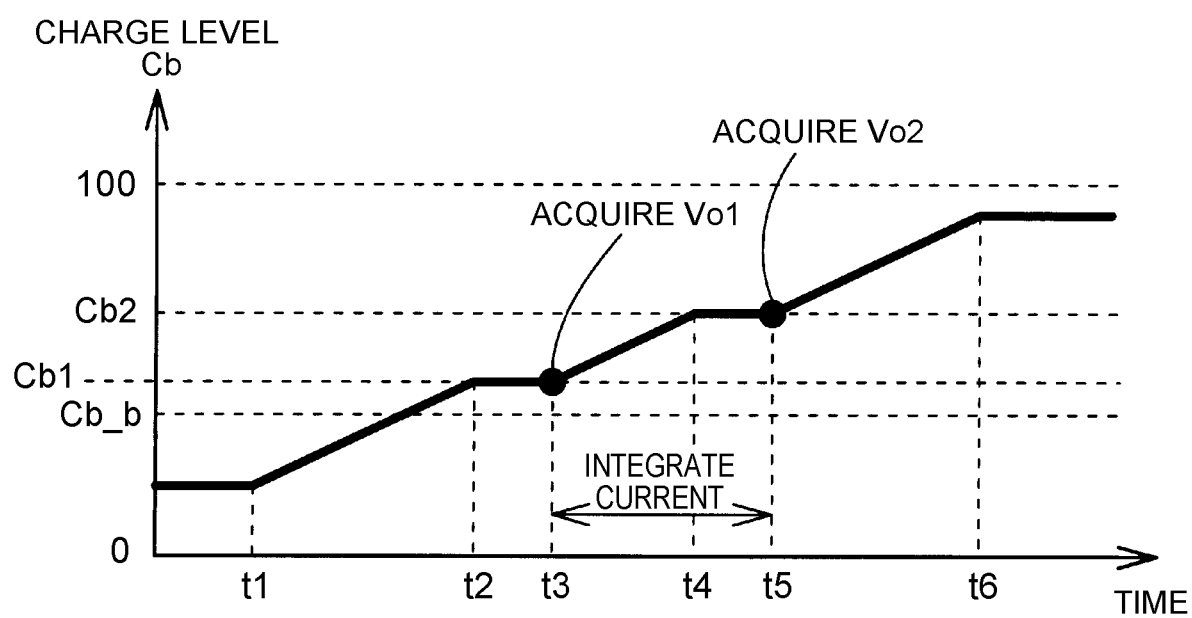
FIG. 5 is a diagram showing an exemplary operation of the parameter acquisition routine in FIGS. 4A and 4B.

FIG. 5 is a diagram showing an exemplary operation of the parameter acquisition routine. In FIG. 5, the abscissa axis indicates time, and the ordinate axis indicates the charge level Cb. In FIG. 5, when the external charge is started at time t1, the charge level Cb gradually increases. Then, when the charge level Cb reaches the first charge level Cb1 at time t2, the control device 14 stops the external charge. As a result, a period in which the charge and discharge are not performed continues. By the continuation of the charge-discharge stop period, the polarization of the battery 12 is gradually eliminated. Then, when the influence of the polarization disappears at time t3, the control device 14 acquires the detected voltage value Vb at time t3, as the first open circuit voltage value Vo1.

After the acquisition of the first open circuit voltage value Vo1, the control device 14 restarts the external charge. By the external charge, the charge level Cb gradually increases. Then, when the charge level Cb reaches the second charge level Cb2 at time t4, the control device 14 stops the external charge again and waits. Then, when the influence of the polarization disappears at time t5, the control device 14 acquires the detected voltage value Vb at time t5, as the second open circuit voltage value Vo2. Further, the control device 14 acquires the integrated value of the detected current value Ib from time t3 to time t5, as the integrated current value $\Delta Ah_{12}$. After the acquisition of the second open circuit voltage value Vo2, the control device 14 starts the external charge again. Then, when the charge level Cb reaches the target charge level at time t6, the control device 14 stops the external charge.

As is obvious from the above description, in the parameter acquisition routine, the open circuit voltage values Vo1, Vo2 and the integrated current value $\Delta Ah_{12}$ are acquired in the non-hysteresis region. In other words, it can be said that the acquired open circuit voltage values Vo1, Vo2 and integrated current value $\Delta Ah_{12}$ are values that are not influenced by the hysteresis. By estimating the aging deterioration based on such values, it is possible to estimate the aging deterioration easily and exactly. Here, the parameter acquisition routine shown in FIGS. 4A and 4B is premised on the external charge, but another type of charge may be adopted as long as the battery 12 can be charged while the vehicle is at a standstill. For example, the battery 12 may be charged with electric power generated by a solar generation panel.

Figure 6:
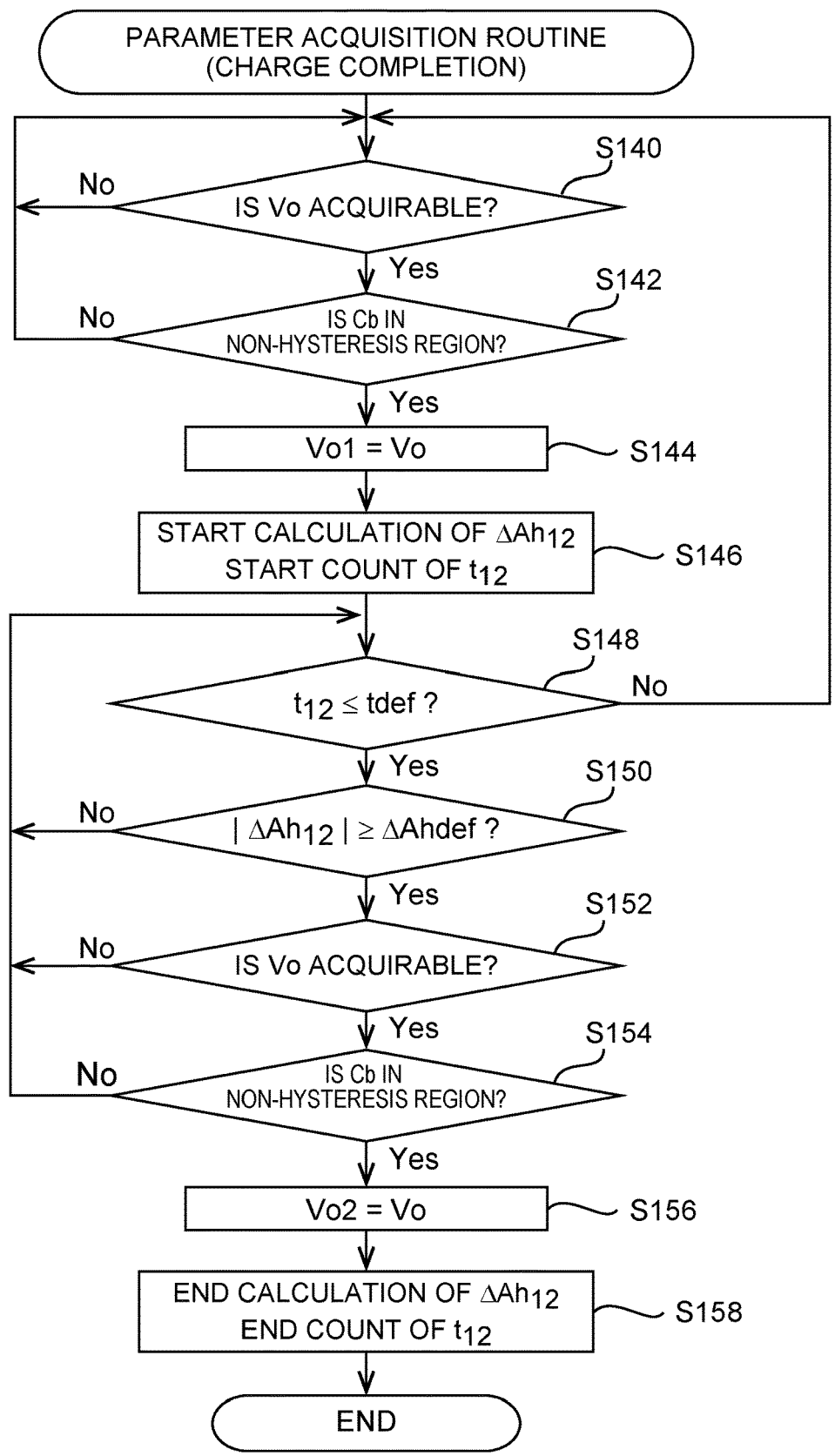
FIG. 6 is a flowchart showing another example of the parameter acquisition routine.

Next, another example of the parameter acquisition routine will be described. FIG. 6 is a flowchart showing another example of the parameter acquisition routine. In the example illustrated in FIG. 6, when the vehicle is driven after the completion of the external charge, the first and second open circuit voltage values Vo1, Vo2 and the integrated current value $\Delta Ah_{12}$ are acquired at the timing when the charge level Cb decreases. That is, typically, in the electrically driven vehicle 100, as necessary, electric power generated by the rotating electric machines MG1, MG2 is stored, or electric power is supplied to the rotating electric machines MG1, MG2 for driving the rotating electric machines MG1, MG2. Therefore, the charge level Cb of the battery 12 is kept at an intermediate value Cb_c (for example, about 30%) that is relatively low and that is in the hysteresis region. Accordingly, when the vehicle is driven after the completion of the external charge, the control device 14 decreases the charge level Cb of the battery 12 to about the intermediate value Cb_c. In the example illustrated in FIG. 6, the parameters necessary for the aging deterioration estimation are acquired at the timing when the charge level Cb decreases from the full charge.

In the example illustrated in FIG. 6, for acquiring the parameters, a reference integrated current value $\Delta Ahdef$ and a reference elapsed time tdef are previously stored. In the flowchart in FIG. 6, the first and second open circuit voltage values Vo1, Vo2 are acquired for the deterioration estimation. For securing the accuracy of the deterioration estimation, it is preferable that the absolute value $|\Delta Ah_{12}|$ of the integrated current value between the acquisition of the first open circuit voltage value Vo1 and the acquisition of the second open circuit voltage value Vo2 be a large value in some degree. The reference integrated current value $\Delta Ahdef$ has a magnitude of the absolute value $|\Delta Ah_{12}|$ of the integrated current value necessary to keep the accuracy of the deterioration estimation. When an elapsed time $t_{12}$ from the acquisition of the first open circuit voltage value Vo1 to the acquisition of the second open circuit voltage value Vo2 is excessively large, an integrated error component included in the integrated current value $\Delta Ah_{12}$ can increase by the influence of errors of the current sensor and can cause a decrease in the accuracy of the deterioration estimation. The reference elapsed time tdef is a time allowing the integrated error of the integrated current value $\Delta Ah_{12}$ to be suppressed to a certain value or less. The reference integrated current value $\Delta Ahdef$ and the reference elapsed time tdef may be fixed values, or may be variable values that vary depending on deterioration degrees of the battery 12 and the current sensor 20, environmental temperature and the like.

The parameter acquisition routine in FIG. 6 is started at the timing when the external charge of the battery 12 is completed. When the external charge has been completed, the control device 14 monitors whether the open circuit voltage value Vo is acquirable (S140). Here, the state where the open circuit voltage value Vo is acquirable includes a state where the polarization of the battery 12 has been eliminated and where the detected voltage value Vb itself can be treated as the open circuit voltage value Vo. Accordingly, for example, it can be said that, after the completion of the external charge, the open circuit voltage value Vo is acquirable immediately after the vehicle is powered on, that is, immediately after a so-called ignition-on. Further, the state where the open circuit voltage value Vo is acquirable includes a state where the polarization component can be accurately estimated although a very low current flows through the battery 12. In this case, the control device 14 acquires a value resulting from correcting the detected voltage value Vb in consideration of an influence of the estimated polarization component, as the open circuit voltage value Vo at the time point. Accordingly, for example, even when the vehicle travels, it can be said that the open circuit voltage value Vo is acquirable in a period in which the vehicle temporarily stops at a traffic light, and in a period in which the vehicle is traveling with only the engine 104 (a period in which the rotating electric machines MG1, MG2 are not being driven).

In the case where the control device 14 determines that the open circuit voltage value Vo is acquirable, the control device 14 checks whether the charge level Cb at the time point is in the non-hysteresis region (S142). The charge level Cb in this case may be estimated mainly based on the open circuit voltage value Vo, or may be estimated mainly based on the integrated current value $\Delta Ah$. In the case where the charge level Cb is not in the non-hysteresis region, the control device 14 returns to step S140. On the other hand, in the case where the charge level Cb is in the non-hysteresis region, the control device 14 acquires the open circuit voltage value Vo at the time point, as the first open circuit voltage value Vo1 (S144).

After the acquisition of the first open circuit voltage value Vo1, the control device 14 starts the calculation of the integrated current value $\Delta Ah_{12}$ and the count of the elapsed time $t_{12}$ (S146). Thereafter, the control device 14 compares the elapsed time $t_{12}$ with the reference elapsed time tdef (S148). In the case where the elapsed time $t_{12}$ is exceeding the reference elapsed time tdef as a result of the comparison (No in S148), the control device 14 determines that the integrated current error is more than the certain value. In this case, the control device 14 returns to step S140, and starts the acquisition of the first open circuit voltage value Vo1 again. On the other hand, in the case where the elapsed time $t_{12}$ is equal to or less than the reference elapsed time tdef (Yes in S148), the control device 14, subsequently, compares the integrated current value $\Delta Ah_{12}$ with the reference integrated current value $\Delta Ahdef$ (S150). In the case of $|\Delta Ah_{12}| < \Delta Ahdef$ as a result of the comparison (No in S150), the control device 14 returns to step S148. On the other hand, in the case of $|\Delta Ah_{12}| \geq \Delta Ahdef$ (Yes in S150), the control device 14 checks whether the open circuit voltage value Vo is acquirable and whether the charge level Cb at the current time is in the non-hysteresis region (S152, S154). In the case where at least one condition is not satisfied as a result of the check (No in S152 or No in S154), the control device 14 returns to step S148. On the other hand, in the case where the open circuit voltage value Vo is acquirable and the charge level Cb is in the non-hysteresis region (Yes in S152 and Yes in S154), the control device 14 acquires the open circuit voltage value Vo at the time point, as the second open circuit voltage value Vo2 (S156).

At the time point when the second open circuit voltage value Vo2 has been acquired, the control device 14 ends the calculation of the integrated current value $\Delta Ah_{12}$ and the count of the elapsed time $t_{12}$ (S158). Thereby, the parameter acquisition routine is ended. In the example of FIG. 6, the integrated current value $\Delta Ah_{12}$ and the elapsed time $t_{12}$ are monitored in the acquisition of the second open circuit voltage value Vo2, but the monitoring of the integrated current value $\Delta Ah_{12}$ and the elapsed time $t_{12}$ may be excluded. That is, in FIG. 6, step S148 and step S150 may be excluded.

Figure 7:
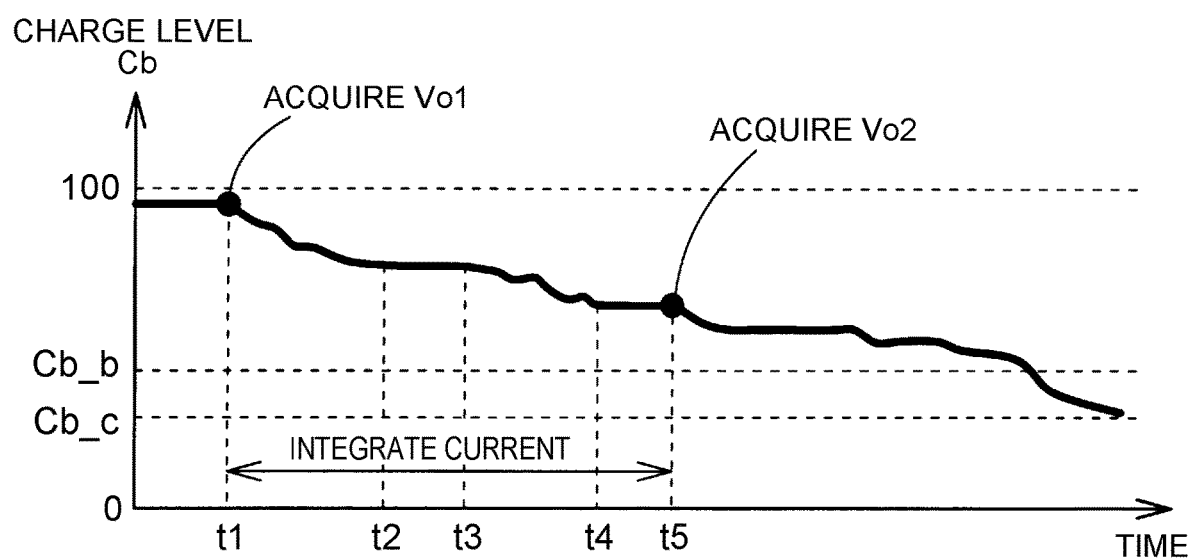
FIG. 7 is a diagram showing an exemplary operation of the parameter acquisition routine in FIG. 6.

FIG. 7 is a diagram showing an exemplary operation of the parameter acquisition routine. In FIG. 7, the abscissa axis indicates time, and the ordinate axis indicates the charge level Cb. In the example of FIG. 7, the reference elapsed time tdef is sufficiently more than the time period from time t1 to time t5. The exemplary operation in FIG. 7 starts in a state where the charge level Cb of the battery 12 is a level (for example, 90%) close to the full charge after the completion of the external charge of the battery 12. At time t1, the electrically driven vehicle 100 is powered on, and the control device 14 starts the routine in FIG. 6. Immediately after the electrically driven vehicle 100 is powered on, the polarization state of the battery 12 has been eliminated, and it can be said that the open circuit voltage value Vo is acquirable. Accordingly, the control device 14 acquires the detected voltage value Vb at time t1 immediately after the electrically driven vehicle 100 is powered on, as the first open circuit voltage value Vo1. Further, the control device 14 starts the calculation of the integrated current value $\Delta Ah_{12}$ and the count of the elapsed time $t_{12}$.

Thereafter, the control device 14 controls the charge and discharge of the battery 12 such that the discharge is greater (for example, an EV traveling), until the charge level Cb reaches a predetermined intermediate value Cb_c (for example, about 30%). Here, suppose that, in a period from time t2 to time t3, the vehicle, for example, stops at a traffic light, the charge amount and discharge amount of the battery 12 decrease and a low-load state continues. In this case, it is possible to acquire the open circuit voltage value Vo at time t3, by removing the estimated polarization component from the detected voltage value Vb. However, at time t3, the absolute value $|\Delta Ah_{12}|$ of the integrated current value is less than the reference integrated current value $\Delta Ahdef$, and therefore, the control device 14 continues the process of the acquisition of the second open circuit voltage value Vo2.

Subsequently, suppose that, in a period from time t4 to time t5, the vehicle, for example, stops at a traffic light again, the charge amount and discharge amount of the battery 12 decrease and a low-load state continues. In this case, it is possible to acquire the open circuit voltage value Vo at time t5, by removing the estimated polarization component from the detected voltage value Vb. Further, suppose that, at time t5, the absolute value $|\Delta Ah_{12}|$ of the integrated current value is more than the reference integrated current value $\Delta Ahdef$, the elapsed time $t_{12}$ is less than the reference elapsed time tdef and the charge level Cb is in the non-hysteresis region. In this case, the control device 14 acquires the open circuit voltage value Vo at time t5, as the second open circuit voltage value Vo2, and ends the parameter acquisition routine.

As is obvious from the above description, also in the parameter acquisition routine shown in FIG. 6, the first and second open circuit voltage values Vo1, Vo2 and the integrated current value $\Delta Ah_{12}$ are acquired in the non-hysteresis region. In other words, it can be said that the acquired open circuit voltage values Vo1, Vo2 and integrated current value $\Delta Ah_{12}$ are values that are not influenced by the hysteresis. By estimating the aging deterioration based on such values, it is possible to estimate the aging deterioration easily and exactly.

Figure 8A:
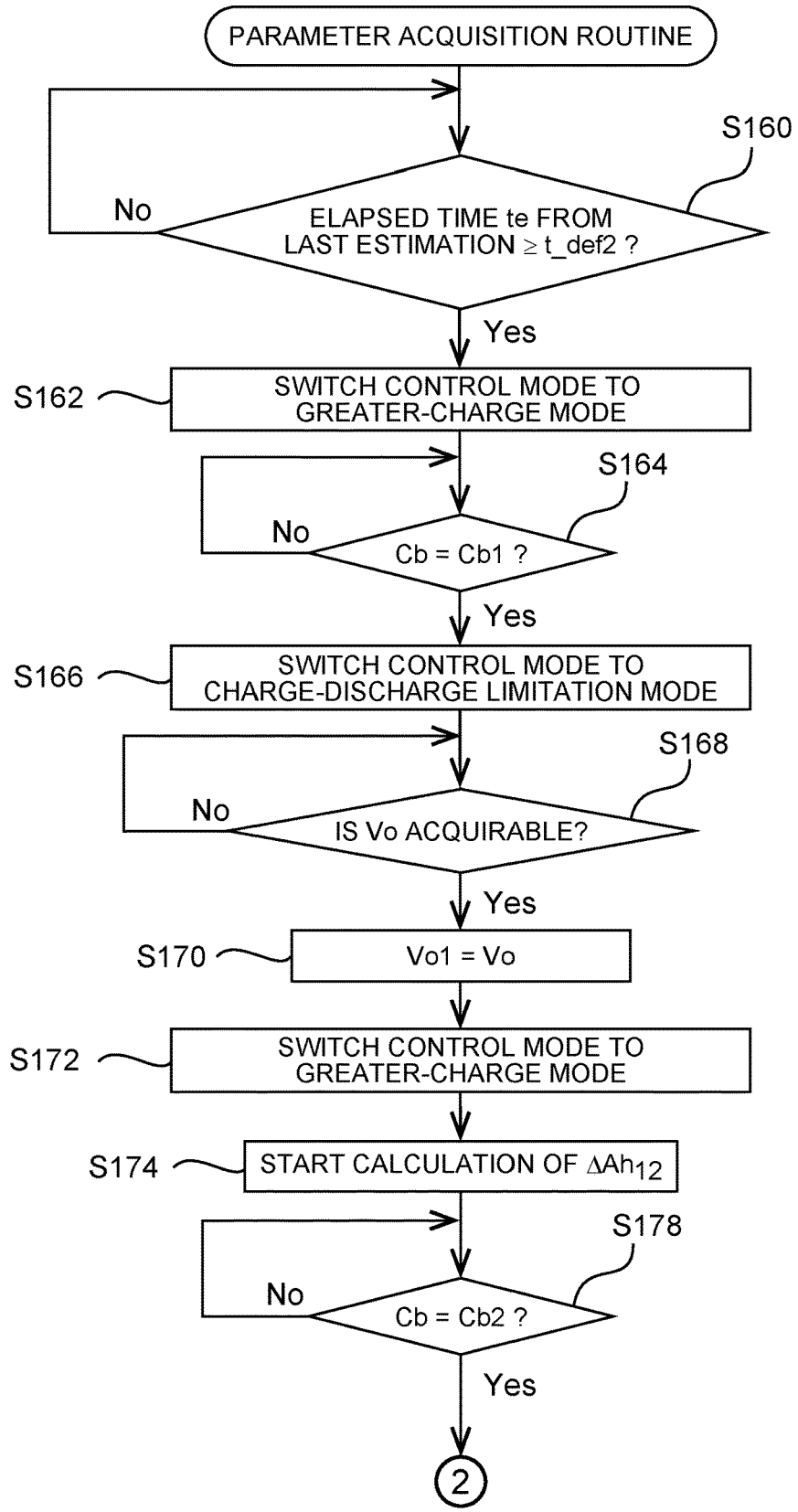
FIG. 8A is a flowchart showing a part of another example of the parameter acquisition routine.
Figure 8B:
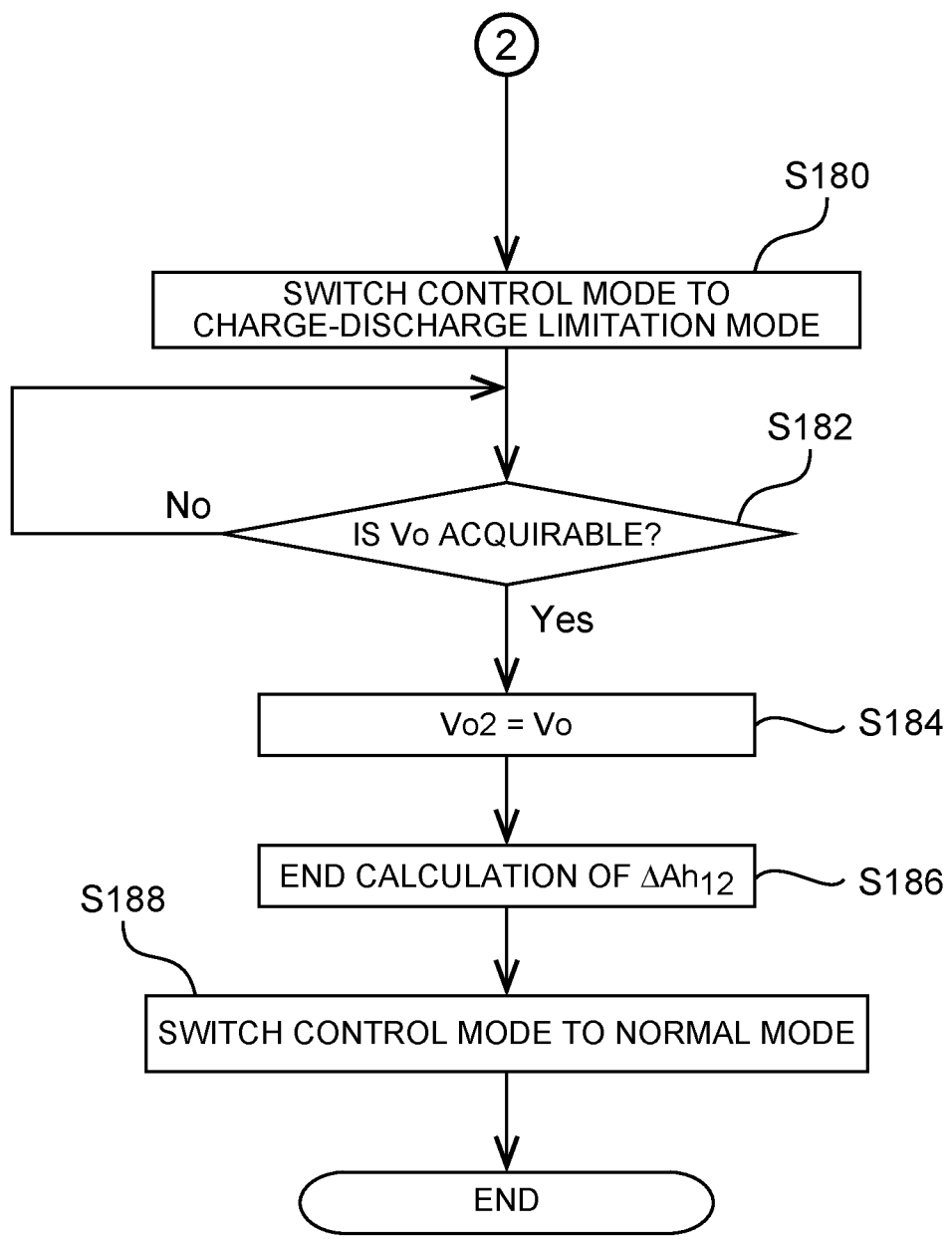
FIG. 8B is a flowchart showing a part of another example of the parameter acquisition routine.

Next, another example of the parameter acquisition routine will be described with reference to FIGS. 8A and 8B. FIGS. 8A and 8B are a flowchart showing another example of the parameter acquisition routine. In the example illustrated in FIGS. 8A and 8B, the timing for the acquisition of the parameters is forcibly generated by controlling the charge and discharge of the battery 12. That is, as already described, in the electrically driven vehicle 100, typically, the charge level Cb of the battery 12 is kept at the intermediate value Cb_c (for example, about 30%) that is relatively low and that is in the hysteresis region. If this state continues for a long time, it is not possible to acquire the parameters that are used for the estimation of the aging deterioration. Accordingly, when an elapsed time to from the last estimation process of the aging deterioration is equal to or more than a prescribed reference time t_def2, the control device 14 forcibly raises the charge level Cb of the battery 12 to the non-hysteresis region, and acquires the parameters necessary for the estimation of the aging deterioration. The value of the reference time t_def2 is not particularly limited because the reference time t_def2 depends on the speed of the deterioration of the battery, and for example, is a value from several weeks to several months.

In the example illustrated in FIGS. 8A and 8B, for acquiring the parameters, a first charge level Cb1 and a second charge level Cb2 are previously stored in the memory 28. The first and second charge level Cb1, Cb2 are nearly the same as the first and second charge levels Cb1, Cb2 described in FIGS. 4A and 4B. The first and second charge levels Cb1, Cb2 each may be fixed values or may be variable values as long as the first and second charge levels Cb1, Cb2 are in the non-hysteresis region.

For executing the parameter acquisition routine, the control device 14 has a normal mode, a greater-charge mode, and a charge-discharge limitation mode, as control modes of the electrically driven vehicle 100. The greater-charge mode is a control mode in which the charge amount of the battery 12 is greater than the discharge amount. For example, in the greater-charge mode, the control device 14 drives the engine 104 such that the engine 104 outputs a dynamic power equal to or higher than a dynamic power that is required for the traveling of the vehicle, and makes the first rotating electric machine MG1 generate electricity using surplus dynamic power of the engine 104. At this time, the control device 14, for the second rotating electric machine MG2, permits only the electric generation using braking power, and prohibits the drive as an electric motor.

The charge-discharge limitation mode is a mode in which both of the charge and discharge of the battery 12 are limited. For example, in the charge-discharge limitation mode, the control device 14 controls the engine 104 such that the engine 104 outputs the dynamic power that is required for the traveling of the vehicle, and limits the drive of the first and second rotating electric machines MG1, MG2 as much as possible. That is, the control device 14 limits also the electric generation of the first and second rotating electric machines MG1, MG2. The normal mode is a control mode that is neither the greater-charge mode nor the charge-discharge limitation mode. As necessary, the control device 14 may perform an electrically driven traveling in which the vehicle travels with only the dynamic power of the second rotating electric machine MG2, or may perform a hybrid vehicle in which the vehicle travels with the dynamic power of the second rotating electric machine MG2 and the engine 104.

In the parameter acquisition routine in FIGS. 8A and 8B, the control device 14 counts the elapsed time te from the last estimation process for the aging deterioration, and monitors whether the elapsed time te is equal to or more than the prescribed reference time t_def2 (S160). When the elapsed time te is equal to or more than the reference time t_def2, the control device 14 switches the control mode of the vehicle to the greater-charge mode (S162). Thereby, the charge level Cb of the battery 12 gradually rises from the intermediate value Cb_c (for example, about 30%) in the hysteresis region, and reaches the non-hysteresis region.

When the charge level Cb of the battery 12 becomes the first charge level Cb1 that is a value in the non-hysteresis region (Yes in S164), the control device 14 switches the control mode to the charge-discharge limitation mode in which both of the charge and the discharge are limited (S166). Thereby, the charge and discharge of the battery 12 are limited, and the open circuit voltage value Vo is likely to be acquired. Then, when the open circuit voltage value Vo is acquirable (Yes in S168), the control device 14 acquires the open circuit voltage value Vo at the time point, as the first open circuit voltage value Vo1 (S170).

After the acquisition of the first open circuit voltage values Vo1, the control device 14 switches the control mode of the electrically driven vehicle 100 to the greater-charge mode again (S172). Further, the control device 14 starts the calculation of the integrated current value $\Delta Ah_{12}$ (S174). As a result of the switching to the greater-charge mode, the charge level Cb of the battery 12 starts to rise again. Then, when the charge level Cb of the battery 12 becomes the second charge level Cb2 (Yes in S178), the control device 14 switches the control mode to the charge-discharge limitation mode again (S180). Then, when the open circuit voltage value Vo is acquirable (Yes in S182), the control device 14 acquires the open circuit voltage value Vo at the time point, as the second open circuit voltage value Vo2 (S184). After the acquisition of the second open circuit voltage value Vo2, the control device 14 ends the calculation of the integrated current value $\Delta Ah_{12}$ (S186). After the acquisition of the first and second open circuit voltage values Vo1, Vo2 and the integrated current value $\Delta Ah_{12}$, the control device 14 switches the control mode of the electrically driven vehicle 100 to the normal mode (S188). In the case where the absolute value $|\Delta Ah_{12}|$ of the integrated current value is less than a prescribed reference value, the accuracy of the deterioration estimation can decrease. Therefore, it is preferable to execute a control such that the absolute value $|\Delta Ah_{12}|$ of the integrated current value becomes equal to or more than the prescribed reference value. Similarly to the flowchart in FIG. 6, in the example, the control device 14 may check the elapsed time $t_{12}$ from the acquisition of the first open circuit voltage value Vo1, immediately before the acquisition of the second open circuit voltage value Vo2. In this case, when the elapsed time $t_{12}$ is exceeding a predetermined reference value, the control device 14 operates the electrically driven vehicle 100 in a greater-discharge mode, without acquiring the second open circuit voltage value Vo2, and then, returns to step S164 to start the acquisition of the first open circuit voltage value Vo1 again.

Figure 9:
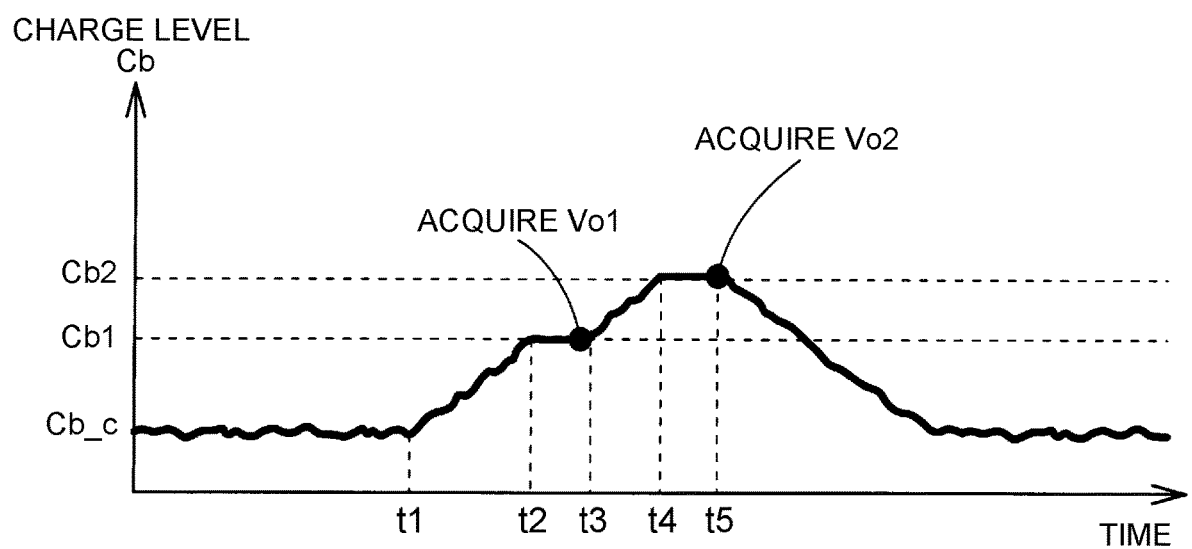
FIG. 9 is a diagram showing an exemplary operation of the parameter acquisition routine in FIGS. 8A and 8B.

FIG. 9 is a diagram showing an exemplary operation of the parameter acquisition routine. In FIG. 9, the abscissa axis indicates time, and the ordinate axis indicates the charge level Cb. The exemplary operation of FIG. 9 starts in a state where the charge level Cb of the battery 12 is kept at about the intermediate value Cb_c in the hysteresis region. Typically, the charge level Cb of the battery 12 is kept around the intermediate value Cb_c. Here, suppose that the elapsed time to from the last aging deterioration estimation process becomes equal to or more than the reference time t_def2 at time t1. In this case, the control device 14 switches the control mode of the vehicle to the greater-charge mode. As a result, the charge level Cb of the battery 12 rises. Then, suppose that the charge level Cb becomes the first charge level Cb1 at time t2. In this case, the control device 14 switches the control mode to the charge-discharge limitation mode. As a result, after time t2, the change in the charge level Cb becomes small. This state continues for a certain time, and, at time t3, the open circuit voltage value Vo becomes acquirable. Then, the control device 14 acquires the open circuit voltage value Vo at time t3, as the first open circuit voltage values Vo1.

After the acquisition of the first open circuit voltage value Vo1, the control device 14 switches the control mode to the greater-charge mode again. Further, the control device 14 starts the calculation of the integrated current value $\Delta Ah_{12}$. As a result, after time t3, the charge level Cb of the battery 12 rises rapidly. Then, at time t4, the charge level Cb becomes the second charge level Cb2, and the control device 14 switches the control mode to the charge-discharge limitation mode again. The state where the charge and discharge are limited continues for a certain time, and, at time t5, the open circuit voltage value Vo becomes acquirable. The control device 14 acquires the open circuit voltage value Vo at time t5, as the second open circuit voltage value Vo2. Further, the control device 14 acquires the integrated value of the detected current value Ib from time t3 to time t5, as the integrated current value $\Delta Ah_{12}$. After the acquisition of the first and second open circuit voltage values Vo1, Vo2 and the integrated current value $\Delta Ah_{12}$, the control device 14 switches the control mode of the hybrid vehicle to the normal mode. As a result, the charge level Cb of the battery 12 decreases to about the intermediate Cb_c.

As is obvious from the above description, also in the parameter acquisition routine shown in FIGS. 8A and 8B, the first and second open circuit voltage values Vo1, Vo2 and the integrated current value $\Delta Ah_{12}$ are acquired in the non-hysteresis region. In other words, it can be said that the acquired open circuit voltage values Vo1, Vo2 and integrated current value $\Delta Ah_{12}$ are values that are not influenced by the hysteresis. By estimating the aging deterioration based on such values, it is possible to estimate the aging deterioration easily and exactly.

In the case where the aging deterioration is not estimated for a long time, the deviation between the actual state of the battery 12 and the SOC-OCV curve and full charge capacity FCC stored in the memory 28 increases. In this case, the estimation accuracy for the charge level Cb of the battery 12 decreases. In the routine shown in FIGS. 8A and 8B, even in the case where the external charge or the like is not executed for a long time, it is possible to acquire the parameters necessary for the estimation of the aging deterioration, when the elapsed time to from the last aging deterioration estimation process becomes equal to or more than the reference time t_def2. Accordingly, it is possible to avoid the problem that the accuracy of the estimation of SOC decreases because the aging deterioration is not estimated for a long time. In the example of FIGS. 8A and 8B, because of Cb1<Cb2, the first open circuit voltage value Vo1 to be acquired for the first time is lower than the second open circuit voltage value Vo2 to be acquired for the second time. However, by the setting of Cb1>Cb2, the control device 14 may first charge the battery 12 until the charge level Cb reaches the first charge level Cb1, to acquire the first open circuit voltage value Vo1, and thereafter, may operate the electrically driven vehicle 100 such that the discharge is greater, to acquire the second open circuit voltage value Vo2 when the charge level Cb has reached the second charge level Cb2 (<Cb1).

The routine shown in FIGS. 8A and 8B is on the premise that the battery 12 can be charged during the traveling of the vehicle. Accordingly, the routine shown in FIGS. 8A and 8B is suitable for electrically driven vehicles that can generate electricity even during the traveling of the vehicles. Examples of such electrically driven vehicles include a hybrid vehicle including an engine as a dynamic power source in addition to a rotating electric machine, an electric driven vehicle provided with a solar panel that generates electricity using solar light, and an electrically driven vehicle equipped with a fuel cell that changes chemical energy of fuel (hydrogen and the like) into electric power.

Next, the deterioration estimation routine (S20) will be described. The deterioration estimation routine (S20) is not particularly limited as long as at least one of the SOC-OCV curve and the full charge capacity FCC of the battery 12 is estimated using the first and second open circuit voltage values Vo1, Vo2 and integrated current value $\Delta Ah_{12}$ acquired in the parameter acquisition routine (S10). Two kinds of deterioration estimation routines (S20) will be exemplified below. However, the deterioration estimation routine (S20) is not limited to them, and various deterioration estimation technologies conventionally proposed can be used.

An example of the deterioration estimation routine (S20) will be described with reference to FIG. 10. The deterioration estimation routine in FIG. 10 estimates the full charge capacity FCC, based on the ratio between a change amount $\Delta Cb$ of the charge level and the integrated current value $\Delta Ah_{12}$. Specifically, the control device 14 checks the first and second open circuit voltage values Vo1, Vo2 acquired in the parameter acquisition routine (S10) against the SOC-OCV curve stored in the memory 28, and thereby, acquires corresponding charge levels Cb[Vo1], Cb[Vo2] (S210, S212). Next, the control device 14 divides the absolute value $|\Delta Ah_{12}|$ of the integrated current value by the charge-level change amount $\Delta Cb=|Cb[Vo1]-Cb[Vo2]|$, and multiplies the resulting value by 100, to calculate the full charge capacity FCC (S214). That is, the control device 14 computes FCC=$|\Delta Ah_{12}|/(|Cb[Vo1]-Cb[Vo2]|)\times 100$. After the calculation of the full charge capacity FCC, the control device 14 modifies and updates the full charge capacity FCC stored in the memory 28, to the calculated full charge capacity FCC (S216).

Next, another example of the deterioration estimation routine (S20) will be described. In the deterioration estimation routine in FIG. 11, three deterioration parameters $k_1$, $k_2$, $\Delta Q_s$ indicating a state of the battery 12 are searched based on the first and second open circuit voltage values Vo1, Vo2 and integrated current value $\Delta Ah_{12}$ acquired in the parameter acquisition routine. A principle of the deterioration estimation routine will be described before a flow of the deterioration estimation routine is described.

As already described, the battery 12 in the embodiment is a lithium ion secondary battery. The lithium ion secondary battery is constituted by a negative electrode, a separator containing an electrolyte, and a positive electrode. The negative electrode and the positive electrode each are composed of aggregates of spherical active materials. At the time of the discharge of the lithium ion secondary battery, on an interface of the active material of the negative electrode, a chemical reaction by which lithium ions Li$^+$ and electrons e$^-$ are released is performed. On the other hand, on an interface of the active material of the positive electrode, a chemical reaction by which lithium ions Li$^+$ and electrons e$^-$ are absorbed is performed. At the time of the charge of the lithium ion secondary battery, reverse reactions of the above reactions are performed.

The negative electrode is provided with a negative electrode current collector that absorbs electrons, and the positive electrode is provided with a positive electrode current collector that releases electrons. The negative electrode current collector is formed of copper, for example, and is connected to a negative electrode terminal. The positive electrode current collector is formed of aluminum, for example, and is connected to a positive electrode terminal. Lithium ions are transferred between the positive electrode and the negative electrode through the separator, so that the charge and discharge of the lithium ion secondary battery are performed.

Here, the charge state in the interior of the lithium ion secondary battery differs depending on lithium concentration distributions in the active materials of the positive electrode and the negative electrode. The output voltage of the lithium ion secondary battery is expressed by the following Formula (1).

$$V = Vo(\theta_1, \theta_2) - R \times I \tag{1}$$

Here, R is a resistance of the whole of the lithium ion secondary battery, and I is a current that flows through the lithium ion secondary battery. The resistance R includes a purely electric resistance against the movement of electrons between the negative electrode and the positive electrode, and a charge movement resistance that acts equivalently as an electric resistance at the time of generation of reaction current on the active material interfaces.

Further, $\theta_1$ is a local charge level on a surface of the positive electrode active material, and $\theta_2$ is a local charge level on a surface of the negative electrode active material. The resistance R has a characteristic of changing depending on changes in $\theta_1$, $\theta_2$ and the battery temperature. In other words, the resistance R can be expressed as a function with $\theta_1$, $\theta_2$ and the battery temperature. The local charge levels $\theta_1$, $\theta_2$ are expressed by the following Formula (2).

$$\theta_i = (C_{se,i})/(C_{s,i,max}) \tag{2}$$

Here, $C_{se,i}$ is the lithium concentration (average value) of the active material (the positive electrode or the negative electrode) on its interface, and $C_{s,i,max}$ is the limiting lithium concentration of the active material (the positive electrode or the negative electrode). As for the subscript i, 1 indicates the positive electrode, and 2 indicates the negative electrode. The limiting lithium concentration is the upper limit of the lithium concentration in the positive electrode or the negative electrode. Each of the local charge levels $\theta_1$, $\theta_2$ of the positive electrode and the negative electrode varies in a range of 0 to 1.

Figure 12:
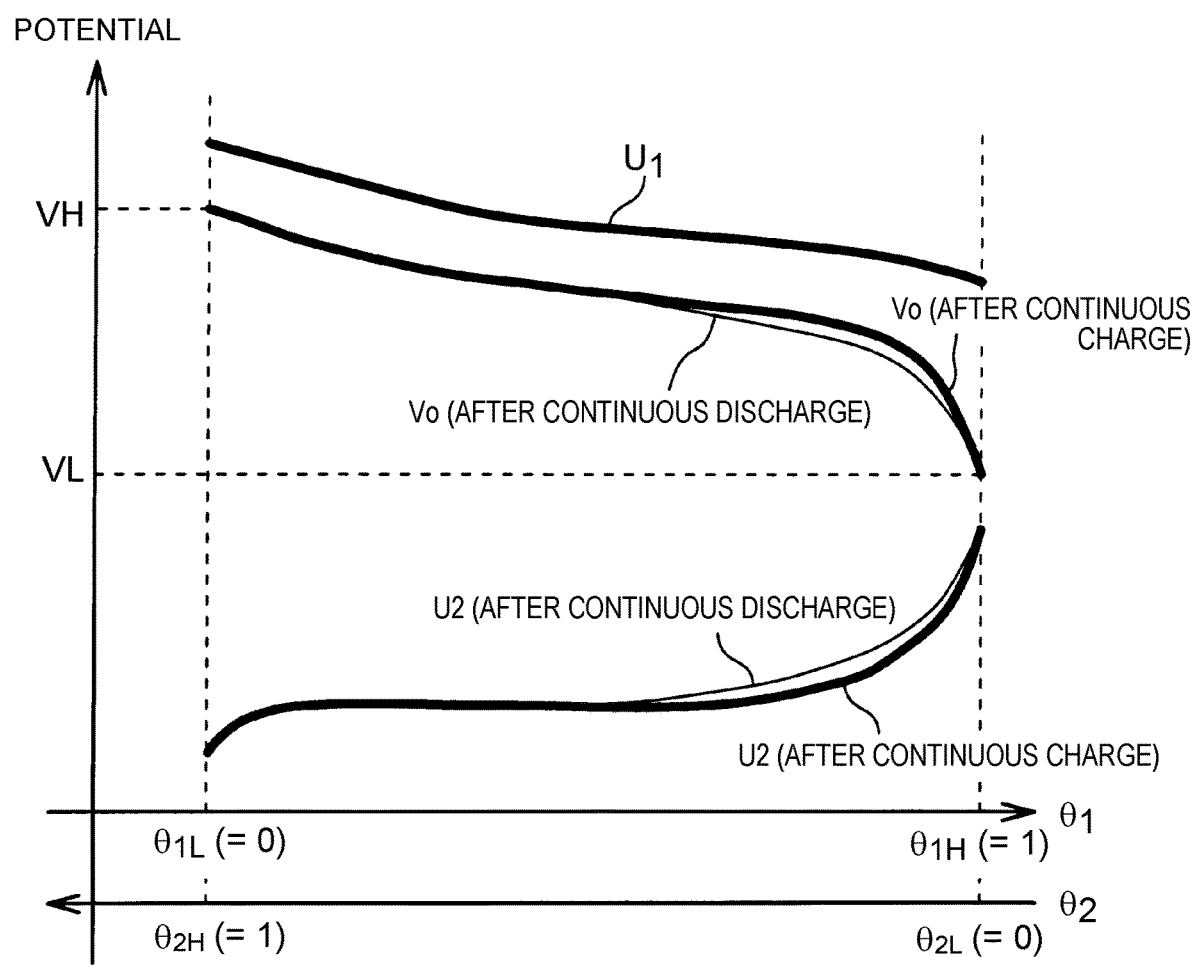
FIG. 12 is a diagram showing a change characteristic of an open circuit voltage with respect to a change in local charge level in a lithium ion secondary battery.

A positive electrode open circuit potential $U_1$ has a characteristic of changing depending on the local charge level $\theta_1$ on the surface of the positive electrode active material, and a negative electrode open circuit potential $U_2$ has a characteristic of changing depending on the local charge level $\theta_2$ on the surface of the negative electrode active material. FIG. 12 shows a relation of the positive electrode open circuit potential $U_1$ to the local charge level $\theta_1$, and a relation of the negative electrode open circuit potential $U_2$ to the local charge level $\theta_2$, when the lithium ion secondary battery is in an initial state. In the battery 12 in the embodiment, since a complex containing a silicon material and graphite is used as the negative electrode active material, the negative electrode open circuit potential $U_2$ partially has a hysteresis. In FIG. 12, the negative electrode open circuit potential $U_2$ shown by the thick line indicates a negative electrode open circuit potential that is obtained in the process in which the battery 12 is charged after the full discharge of the battery 12 (hereinafter, referred to as a "time after a continuous charge"), and the negative electrode open circuit potential $U_2$ shown by the thin line indicates a negative electrode open circuit potential that is obtained in the process in which the battery 12 is discharged after the full charge of the battery 12 (hereinafter, referred to as a "time after a continuous discharge"). Similarly, the open circuit voltage value Vo shown by the thick line indicates an open circuit voltage after the continuous charge, and the open circuit voltage value Vo shown by the thin line indicates an open circuit voltage after the continuous discharge. Hereinafter, when it is unnecessary to distinguish the time after the continuous charge and the time after the continuous discharge, description will be made only for the negative electrode open circuit potential $U_2$ and open circuit voltage value Vo after the continuous charge.

As shown in FIG. 12, the open circuit voltage value Vo of the lithium ion secondary battery is shown as the potential difference between the positive electrode open circuit potential $U_1$ and the negative electrode open circuit potential $U_2$. Since the negative electrode open circuit potential $U_2$ partially has a hysteresis as already described, the open circuit voltage value Vo also partially has a hysteresis. The initial state means a state where the lithium ion secondary battery is not deteriorated, and for example, means a state immediately after the lithium ion secondary battery is produced.

As shown in FIG. 12, when the local charge level $\theta_1$ of the positive electrode is $\theta_{1H}$ (=1), the positive electrode open circuit potential $U_1$ is lowest (the Li amount in the positive electrode is largest). On the other hand, when the local charge level $\theta_2$ of the negative electrode is $\theta_{2L}$ (=0), the negative electrode open circuit potential $U_2$ is highest (the Li amount in the negative electrode is smallest). Data indicating the characteristics ($U_1$, $U_2$) can be previously stored in the memory 28 as a map.

The open circuit voltage value Vo of the lithium ion secondary battery has a characteristic of decreasing with the discharge from the full charge state. Further, in the lithium ion secondary battery after the deterioration, the voltage decrease amount in the same discharge time is larger than in the lithium ion secondary battery in the initial state. This means that the deterioration of the lithium ion secondary battery causes a decrease in the full charge capacity and a change in the open circuit voltage curve. In the embodiment, modeling of the change in the open circuit voltage curve associated with the deterioration of the lithium ion secondary battery is performed based on two phenomena that are likely to occur in the interior of the lithium ion secondary battery in the deteriorated state. The two phenomena are a decrease in single-electrode capacity in the positive electrode and the negative electrode, and a composition correspondence gap between the positive electrode and the negative electrode.

The decrease in single-electrode capacity shows a decrease in ability to receive lithium in each of the positive electrode and the negative electrode. The decrease in the ability to receive lithium means a decrease in the active material and the like that effectively function in the charge and discharge.

Figure 13:
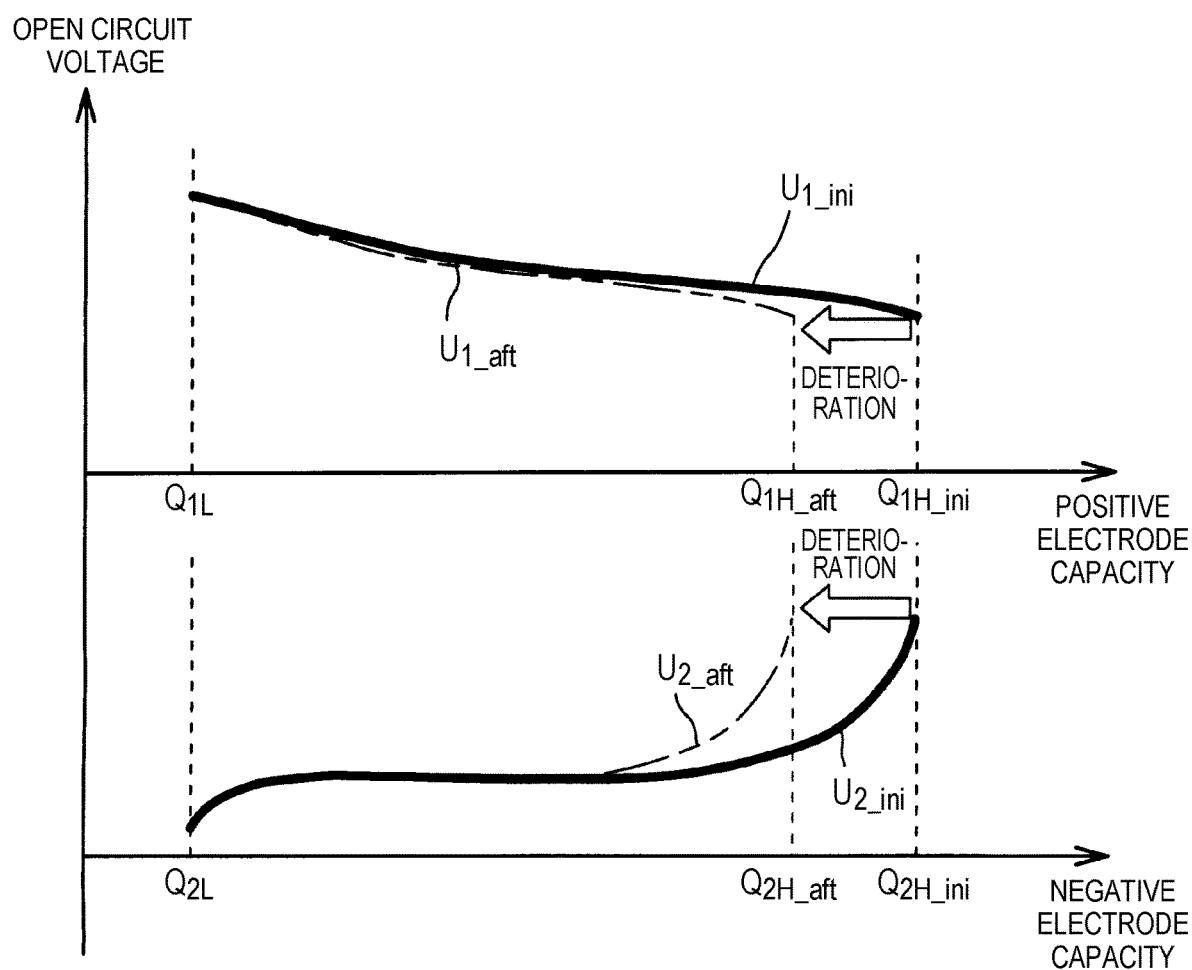
FIG. 13 is a diagram showing a change in open circuit potential of a positive electrode associated with a decrease in positive electrode capacity and a change in open circuit potential of a negative electrode associated with a decrease in negative electrode capacity, in the lithium ion secondary battery.

FIG. 13 schematically shows a change in the positive electrode open circuit potential $U_1$ due to a decrease in positive electrode capacity and a change in the negative electrode open circuit potential $U_2$ due to a decrease in negative electrode capacity. In FIG. 13, $Q_{1L}$ on the axis of the positive electrode capacity is a capacity corresponding to the local charge level $\theta_{1L}$ (=0) in FIG. 12, in the initial state of the lithium ion secondary battery. $Q_{1H\_ini}$ is a capacity corresponding to the charge level $\theta_{1H}$ (=1) in FIG. 12, in the initial state of the lithium ion secondary battery. Further, $Q_{2L}$ on the axis of the negative electrode capacity is a capacity corresponding to the local charge level $\theta_{2H}$ (=1) in FIG. 12, in the initial state of the lithium ion secondary battery, and $Q_{2H\_ini}$ is a capacity corresponding to the local charge level $\theta_{2L}$ (=0) in FIG. 12, in the initial state of the lithium ion secondary battery.

In the positive electrode, when the ability to receive lithium decreases, the capacity corresponding to the local charge level $\theta_{1L}$ (=1) changes from $Q_{1H\_ini}$ to $Q_{1H\_aft}$. Further, in the negative electrode, when the ability to receive lithium decreases, the capacity corresponding to the local charge level $\theta_{2L}$ (=0) changes from $Q_{2H\_ini}$ to $Q_{2H\_aft}$.

Here, even when the lithium ion secondary battery deteriorates, the relation (the relation shown in FIG. 12) of the positive electrode open circuit potential $U_1$ to the local charge level $\theta_1$ does not change. Therefore, when the relation of the positive electrode open circuit potential $U_1$ to the local charge level $\theta_1$ is converted into a relation of the positive electrode open circuit potential $U_1$ to the positive electrode capacity, a curve (alternate long and two short dashes line) indicating a relation of a positive electrode open circuit potential $U_{1\_aft}$ to the positive electrode capacity in the deteriorated state, as shown in FIG. 13, is a curve shrunk from a curve $U_{1\_ini}$ (solid line) in the initial state by an amount corresponding to the deterioration of the lithium ion secondary battery.

Similarly, when the relation of the negative electrode open circuit potential $U_2$ to the local charge level $\theta_2$ is converted into a relation of the negative electrode open circuit potential $U_2$ to the negative electrode capacity, a curve (alternate long and two short dashes line) indicating a relation of a negative electrode open circuit potential $U_2$ aft to the negative electrode capacity in the deteriorated state, as shown in FIG. 13, is a curve shrunk from a curve $U_{2\_ini}$ (solid line) in the initial state by an amount corresponding to the deterioration of the lithium ion secondary battery.

Figure 14:
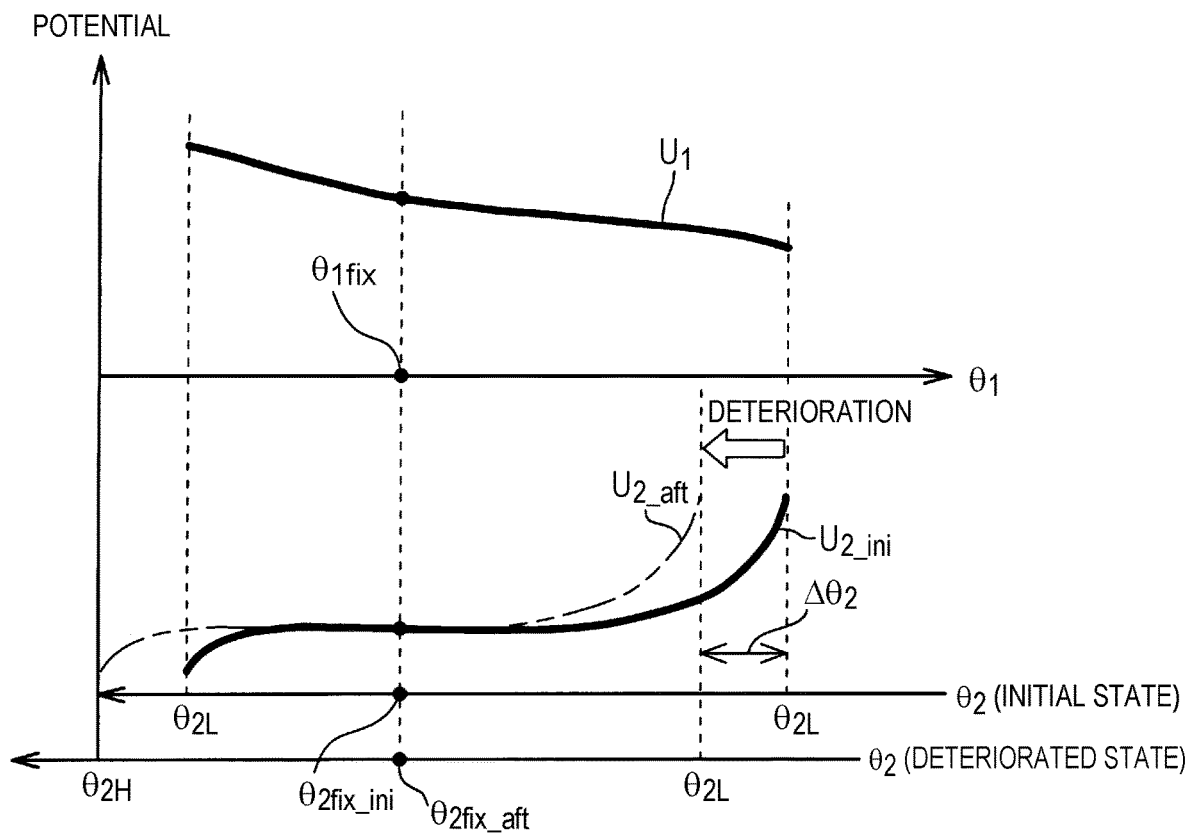
FIG. 14 is a diagram for describing a gap in composition correspondence between the positive electrode and negative electrode of the lithium ion secondary battery.

Next, the composition gap will be described. FIG. 14 schematically shows a gap in composition correspondence between the positive electrode and the negative electrode. The gap in composition correspondence is a gap in the combination of the composition ($\theta_1$) of the positive electrode and the composition ($\theta_2$) of the negative electrode with the initial state of the lithium ion secondary battery, when the charge and discharge are performed using the positive electrode and the negative electrode.

Curves indicating relations of the positive electrode and negative electrode open circuit potentials $U_1$, $U_2$ to the local charge levels $\theta_1$, $\theta_2$ of the positive electrode and the negative electrode are the same as the curves shown in FIG. 12. Here, when the lithium ion secondary battery deteriorates, the axis of the negative electrode composition $\theta_2$ shifts by $\Delta\theta_2$ in the direction of the decrease in the positive electrode composition $\theta_1$. Thereby, a curve (alternate long and two short dashes line) indicating a relation of a negative electrode open circuit potential $U_{2\_aft}$ to the axis of the negative electrode composition $\theta_2$ in the deteriorated state is a curve shifted by $\Delta\theta_2$ in the direction of the decrease in the positive electrode composition $\theta_1$ from a curve (solid line) indicating the negative electrode open circuit potential $U_{2\_ini}$ to the axis of the negative electrode composition $\theta_2$ in the initial state.

As a result, the composition of the negative electrode corresponding to a composition $\theta_{1fix}$ of the positive electrode is "$\theta_{2fix\_ini}$" in the initial state of the lithium ion secondary battery, but is "$\theta_{2fix\_aft}$" after the deterioration of the lithium ion secondary battery.

Figure 11:
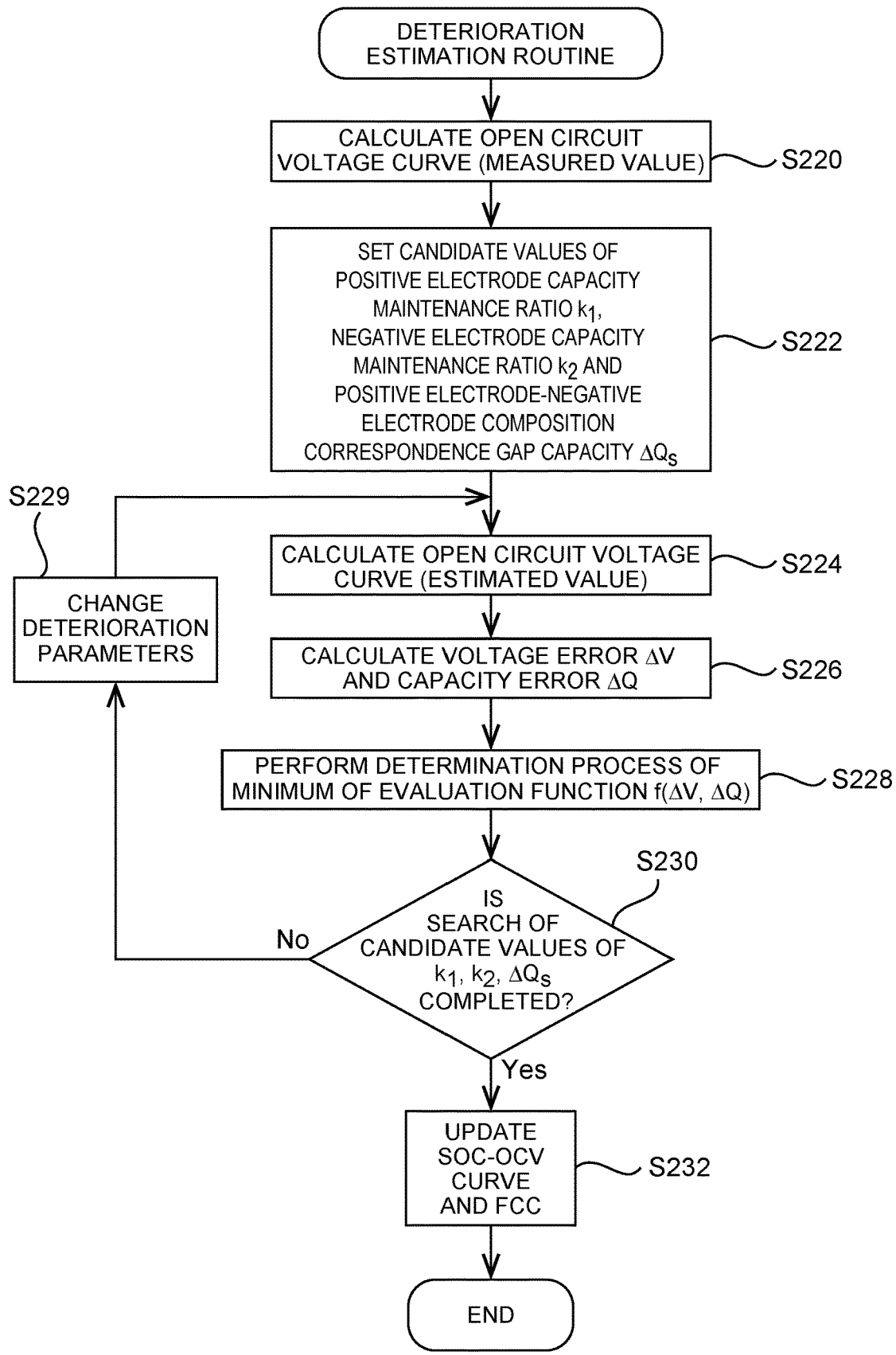
FIG. 11 is a flowchart showing another example of the deterioration estimation routine.

In the deterioration estimation routine shown in FIG. 11, the modeling of the above-described two phenomena is performed by adopting three deterioration parameters in a battery model. The three deterioration parameters are a positive electrode capacity maintenance ratio $k_1$, a negative electrode capacity maintenance ratio $k_2$, and a positive electrode-negative electrode composition correspondence gap capacity $\Delta Q_s$. A method of the modeling of the two deteriorated phenomena will be described below.

The positive electrode capacity maintenance ratio $k_1$ is the ratio of the positive electrode capacity in the deteriorated state to the positive electrode capacity in the initial state. Here, suppose that the positive electrode capacity decreases by an arbitrary amount from the capacity in the initial state, after the lithium ion secondary battery becomes the deteriorated state. In this case, the positive electrode capacity maintenance ratio $k_1$ is expressed by the following Formula (3).

$$k_1 = \frac{(Q_{1\_ini} - \Delta Q_1)}{Q_{1\_ini}} \quad (3)$$

Here, $Q_{1\_ini}$ represents the positive electrode capacity in the initial state of the lithium ion secondary battery, and $\Delta Q_1$ represents the decrease amount of the positive electrode capacity due to the deterioration of the lithium ion secondary battery. Accordingly, the positive electrode capacity after the lithium ion secondary battery becomes the deteriorated state is $(Q_{1\_ini} - \Delta Q_1)$. Further, $k_1$ decreases from 1, which is the value in the initial state. Here, the positive electrode capacity $Q_{1\_ini}$ in the initial state can be previously evaluated from the theoretical capacity and preparation amount of the active material, and the like.

The negative electrode capacity maintenance ratio $k_2$ is the ratio of the negative electrode capacity in the deteriorated state to the negative electrode capacity in the initial state. Here, suppose that the negative electrode capacity decreases by an arbitrary amount from the capacity in the initial state, after the lithium ion secondary battery becomes the deteriorated state. In this case, the negative electrode capacity maintenance ratio $k_2$ is expressed by the following Formula (4).

$$k_2 = \frac{(Q_{2\_ini} - \Delta Q_2)}{Q_{2\_ini}} \quad (4)$$

Here, $Q_{2\_ini}$ represents the negative electrode capacity in the initial state of the lithium ion secondary battery, and $\Delta Q_2$ represents the decrease amount of the negative electrode capacity due to the deterioration of the lithium ion secondary battery. Accordingly, the negative electrode capacity after the lithium ion secondary battery becomes the deteriorated state is $(Q_{2\_ini} - \Delta Q_2)$. Further, $k_2$ decreases from 1, which is the value in the initial state. Here, the negative electrode capacity $Q_{2\_ini}$ in the initial state can be previously evaluated from the theoretical capacity and preparation amount of the active material, and the like.

Figure 15:
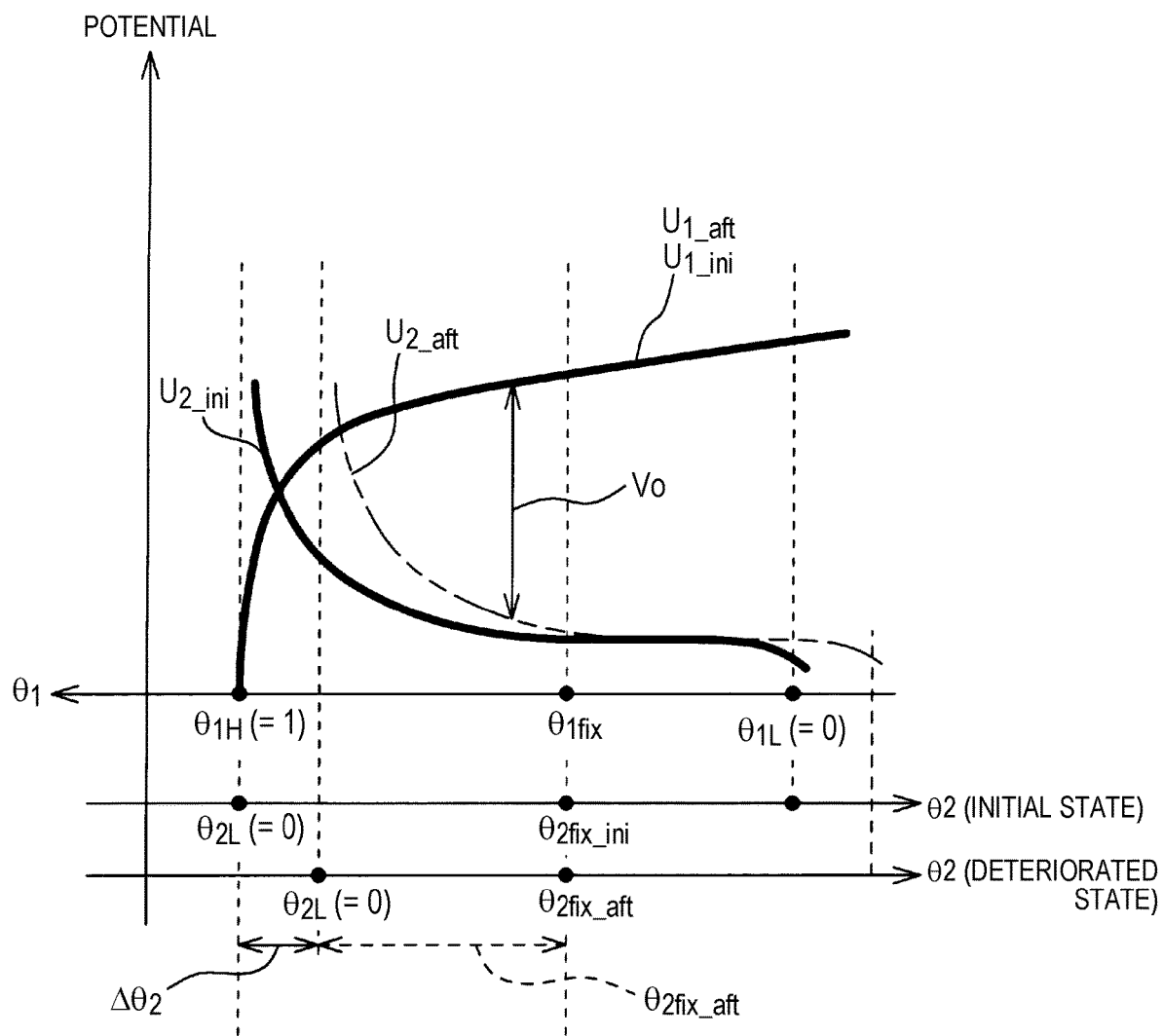
FIG. 15 is a diagram for describing a gap in composition correspondence due to the deterioration of the lithium ion secondary battery.

FIG. 15 is a schematic diagram for describing a gap in composition correspondence between the positive electrode and the negative electrode. In the case where the lithium ion secondary battery is in the deteriorated state, the negative electrode capacity when the negative electrode composition $\theta_2$ is 1 is $(Q_{2\_ini} - \Delta Q_2)$. The positive electrode-negative electrode composition correspondence gap capacity $\Delta Q_s$ is a capacity corresponding to a gap amount $\Delta\theta_2$ of the negative electrode composition axis $\theta_2$ with respect to the positive electrode composition axis $\theta_1$. Thereby, the relation of the following Formula (5) is satisfied. The positive electrode-negative electrode composition correspondence gap capacity $\Delta Q_s$ indicates a variation amount of the battery capacity due to a change from the initial state in the correspondence relation between the local charge level $\theta_1$ as the local charge level on the surface of the positive electrode active material and the local charge level $\theta_2$ as the local charge level on the surface of the negative electrode active material.

$$\Delta\theta_1 : 1 = \Delta Q_s : (Q_{2\_ini} - \Delta Q_2) \quad (5)$$

The following Formula (6) is obtained from Formula (4) and Formula (5).

$$\Delta Q_s = k_2 \times Q_{2\_ini} \times \Delta\theta_2 \quad (6)$$

When the lithium ion secondary battery is in the initial state, the positive electrode composition $\theta_{1fix}$ corresponds to the negative electrode composition $\theta_{2fix\_ini}$. When the lithium ion secondary battery is in the deteriorated state, the positive electrode composition $\theta_{1fix}$ corresponds to the negative electrode composition $\theta_{2fix\_aft}$.

In the case where the gap in composition correspondence between the positive electrode and the negative electrode appears due to the deterioration of the lithium ion secondary battery, the negative electrode composition $\theta_{2fix\_aft}$ after the deterioration of the lithium ion secondary battery has the relation of the following Formula (7).

$$\theta_{2fix\_aft} = \frac{(1 - \theta_{1fix}) \times k_1 \times Q_{1\_ini} \times \Delta Q_S}{k_2 \times Q_{2\_ini}} \quad (7)$$

The meaning of Formula (7) will be described. When lithium is released from the positive electrode by the charge in the deteriorated state of the lithium ion secondary battery, the positive electrode composition $\theta_1$ decreases from 1. When the positive electrode composition $\theta_1$ decreases from 1 to $\theta_{1fix}$, an amount F1 of lithium that is released from the positive electrode is expressed by the following Formula (8).

$$F1 = (1 - \theta_{1fix}) \times k_1 \times Q_{1\_ini} \quad (8)$$

Here, the value of $(1 - \theta_{1fix})$ indicates the decrease amount of the positive electrode composition $\theta_1$ due to the charge of the lithium ion secondary battery, and the value of $(k_1 \times Q_{1\_ini})$ indicates the positive electrode capacity after the deterioration of the lithium ion secondary battery.

If all of the lithium released from the positive electrode is taken in the negative electrode, the negative electrode composition $\theta_{2fix\_ini}$ is expressed by the following Formula (9).

$$\theta_{2fix\_ini} = \frac{(1 - \theta_{1fix}) \times k_1 \times Q_{1\_ini}}{k_2 \times Q_{2\_ini}} \quad (9)$$

Here, the value of $(k_2 \times Q_{2\_ini})$ indicates the negative electrode capacity after the deterioration of the lithium ion secondary battery.

On the other hand, when the gap $(\Delta\theta_2)$ in composition correspondence between the positive electrode and the negative electrode appears, the negative electrode composition $\theta_{2fix\_aft}$ after the deterioration is expressed by the following Formula (10).

$$\theta_{2fix\_aft} = \frac{(1 - \theta_{1fix}) \times k_1 \times Q_{1\_ini}}{k_2 \times Q_{2\_ini}} - \Delta\theta_2 \quad (10)$$

The gap amount $\Delta\theta_2$ in composition correspondence can be expressed by Formula (6), using the positive electrode-negative electrode composition correspondence gap capacity $\Delta Q_s$. Thereby, the negative electrode composition $\theta_{2fix\_aft}$ after the deterioration is expressed by the above Formula (7).

As shown in FIG. 15, the open circuit voltage value Vo in the deteriorated state of the lithium ion secondary battery is expressed as the potential difference between the positive electrode open circuit potential $U_{1\_aft}$ and negative electrode open circuit potential $U_{2\_aft}$ in the deteriorated state. That is, by identifying the three deterioration parameters: the positive electrode capacity maintenance ratio $k_1$, the negative electrode capacity maintenance ratio $k_2$ and the positive electrode-negative electrode composition correspondence gap capacity $\Delta Q_s$, it is possible to identify the negative electrode open circuit potential $U_{2\_aft}$ in the deteriorated state of the lithium ion secondary battery, and to calculate the open circuit voltage value Vo as the potential difference between the negative electrode open circuit potential $U_{2\_aft}$ and the positive electrode open circuit potential $U_{1\_ini}$.

That is, since it is possible to previously evaluate the positive electrode capacity $Q_{1\_ini}$ and negative electrode capacity $Q_{2\_ini}$ in the initial state from the theoretical capacities and preparation amounts of the active materials, it is possible to calculate the negative electrode composition $\theta_{2fix\_aft}$ in the deteriorated state using Formula (7), when it is possible to identify the three deterioration parameters: the positive electrode capacity maintenance ratio $k_1$, the negative electrode capacity maintenance ratio $k_2$ and the positive electrode-negative electrode composition correspondence gap capacity $\Delta Q_s$. Further, it is possible to calculate the gap amount $\Delta\theta_2$ in composition correspondence using Formula (6). From the gap amount $\Delta\theta_2$, as shown in FIG. 12, it is possible to identify the position of 0 of the negative electrode composition axis $\theta_2$ in the deteriorated state that corresponds to the position when the positive electrode composition $\theta_1$ in the deteriorated state is 1, and the negative electrode composition $\theta_{2fix\_aft}$. Then, from the positions of 0 and $\theta_{2fix\_aft}$, as shown in FIG. 12, it is possible to identify the position of 1 of the negative electrode composition axis $\theta_2$ in the deteriorated state.

The relation of the positive electrode open circuit potential $U_1$ to the local charge level $\theta_1$ of the positive electrode and the relation of the negative electrode open circuit potential $U_2$ to the local charge level $\theta_2$ of the negative electrode (the relations shown in FIG. 12) do not change, even when the lithium ion secondary battery deteriorates. Accordingly, when it is possible to identify the positions of 0 and 1 of the negative electrode composition axis $\theta_2$ in the deteriorated state that correspond to the positions of 1 and 0 of the positive electrode composition $\theta_1$ in the deteriorated state, a curve indicating the relation of the positive electrode open circuit potential $U_1$ to the local charge level $\theta_1$ of the positive electrode shown in FIG. 12 is drawn between 1 and 0 of the positive electrode composition $\theta_1$ in the deteriorated state, and a curve indicating the relation of the negative electrode open circuit potential $U_2$ to the local charge level $\theta_2$ of the negative electrode shown in FIG. 12 is drawn between 1 and 0 of the positive electrode composition $\theta_1$ in the deteriorated state, so that the curves become the positive electrode open circuit potential $U_1$ and negative electrode open circuit potential $U_2$ in the deteriorated state shown in FIG. 12. Thus, it is possible to identify the curves indicating the positive electrode open circuit potential $U_1$ and the negative electrode open circuit potential $U_2$, and therefore, it is possible to calculate the open circuit voltage value Vo of the lithium ion secondary battery in the deteriorated state.

As described above, it is possible to calculate the open circuit voltage value Vo of the lithium ion secondary battery in the deteriorated state, by identifying the three deterioration parameters: the positive electrode capacity maintenance ratio $k_1$, the negative electrode capacity maintenance ratio $k_2$ and the positive electrode-negative electrode composition correspondence gap capacity $\Delta Q_s$.

In the lithium ion secondary battery in the initial state, the positive electrode capacity maintenance ratio $k_1$ is 1, the negative electrode capacity maintenance ratio $k_2$ is 1, and the positive electrode-negative electrode composition correspondence gap capacity $\Delta Q_s$ is 0. The open circuit voltage value Vo calculated (estimated) as described above coincides with the value (measured value) when the open circuit voltage value Vo of the lithium ion secondary battery in the initial state (a new lithium ion secondary battery) is measured.

Figure 16:
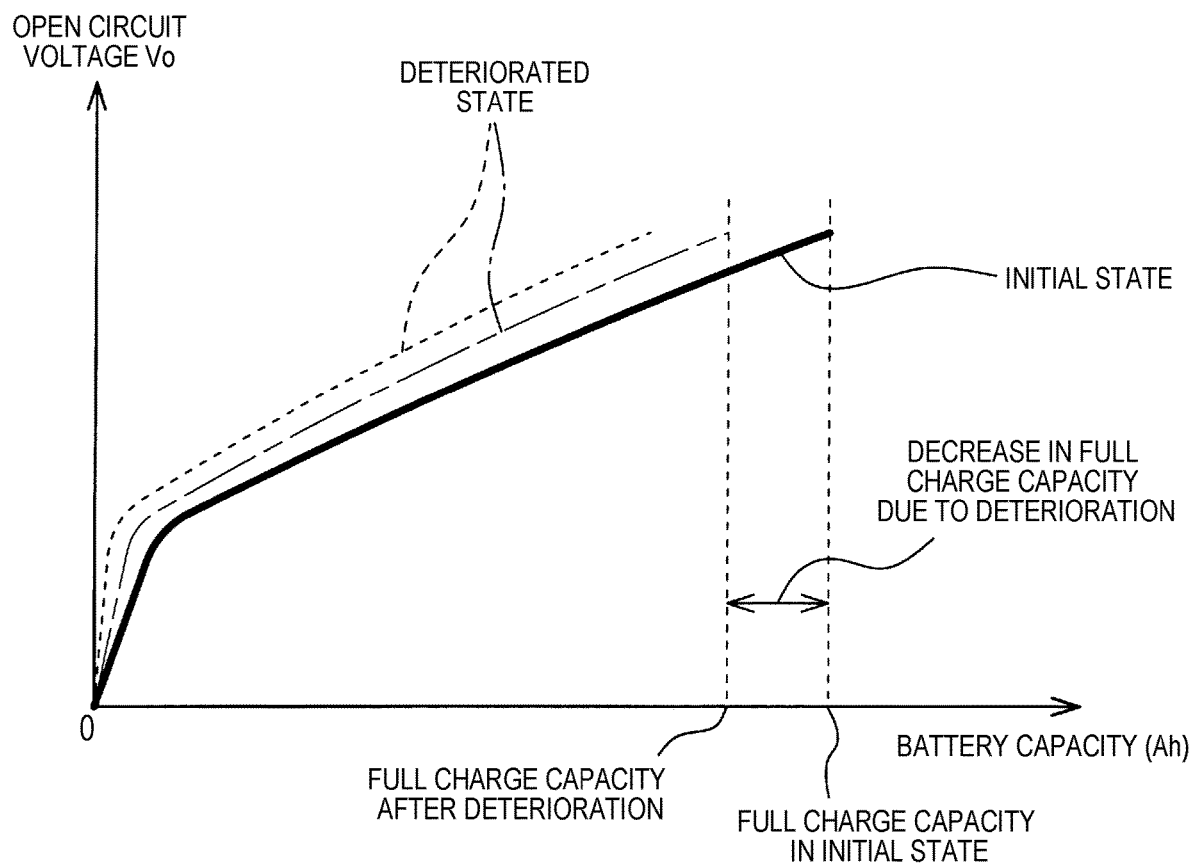
FIG. 16 is a diagram showing a change (open circuit voltage curve) in open circuit voltage with respect to the battery capacity of the lithium ion secondary battery.

As shown in FIG. 16, the open circuit voltage value Vo of the lithium ion secondary battery increases with the increase in the battery capacity ($\Delta Ah$), that is, with the charge of the secondary battery. Hereinafter, a change curve of the open circuit voltage value Vo with respect to the battery capacity ($\Delta Ah$) is referred to as an open circuit voltage curve. As shown by the alternate long and short dash line and broken line in FIG. 16, the open circuit voltage curve shifts from the initial state to the left side in the figure, due to the deterioration of the battery 12.

As described above, it is possible to calculate the open circuit voltage value Vo of the lithium ion secondary battery in the deteriorated state, from the three deterioration parameters: the positive electrode capacity maintenance ratio $k_1$, the negative electrode capacity maintenance ratio $k_2$ and the positive electrode-negative electrode composition correspondence gap capacity $\Delta Q_s$, and therefore, it is possible to calculate the open circuit voltage curve for the lithium ion secondary battery, from the positive electrode capacity maintenance ratio $k_1$, the negative electrode capacity maintenance ratio $k_2$ and the positive electrode-negative electrode composition correspondence gap capacity $\Delta Q_s$.

Hence, in the deterioration estimation routine shown in FIG. 11, there is performed a convergent calculation for searching values of ($k_1$, $k_2$, $\Delta Q_s$) allowing the open circuit voltage curve (estimated value) in the deteriorated state calculated based on the three deterioration parameters: the positive electrode capacity maintenance ratio $k_1$, the negative electrode capacity maintenance ratio $k_2$ and the positive electrode-negative electrode composition correspondence gap capacity $\Delta Q_s$, to roughly coincide with the open circuit voltage curve (measured value). Thereby, it is possible to identify the positive electrode capacity maintenance ratio $k_1$, negative electrode capacity maintenance ratio $k_2$ and positive electrode-negative electrode composition correspondence gap capacity $\Delta Q_s$ in a certain deteriorated state, and it is possible to estimate a capacity deterioration of the lithium ion secondary battery.

Specifically, with reference to FIG. 11, a flow of the deterioration estimation routine will be described. In the deterioration estimation routine shown in FIG. 11, the control device 14, first, plots the first and second open circuit voltage values Vo1, Vo2 and integrated current value $\Delta Ah_{12}$ acquired in the parameter acquisition routine (S10), and generates the open circuit voltage curve (measured value) (S220).

Next, the control device 14 sets candidates of the deterioration parameters ($k_1$, $k_2$, $\Delta Q_s$) for generating the open circuit voltage characteristic (estimated value) (S222). Next, the control device 14 generates the open circuit voltage curve (estimated value), using the set deterioration parameters (S224). The principle of the generation has been described with reference to FIG. 12 to FIG. 15. FIG. 16 is a diagram showing an example of the open circuit voltage curve (measured value) and the open circuit voltage curve (estimated value).

Figure 17:
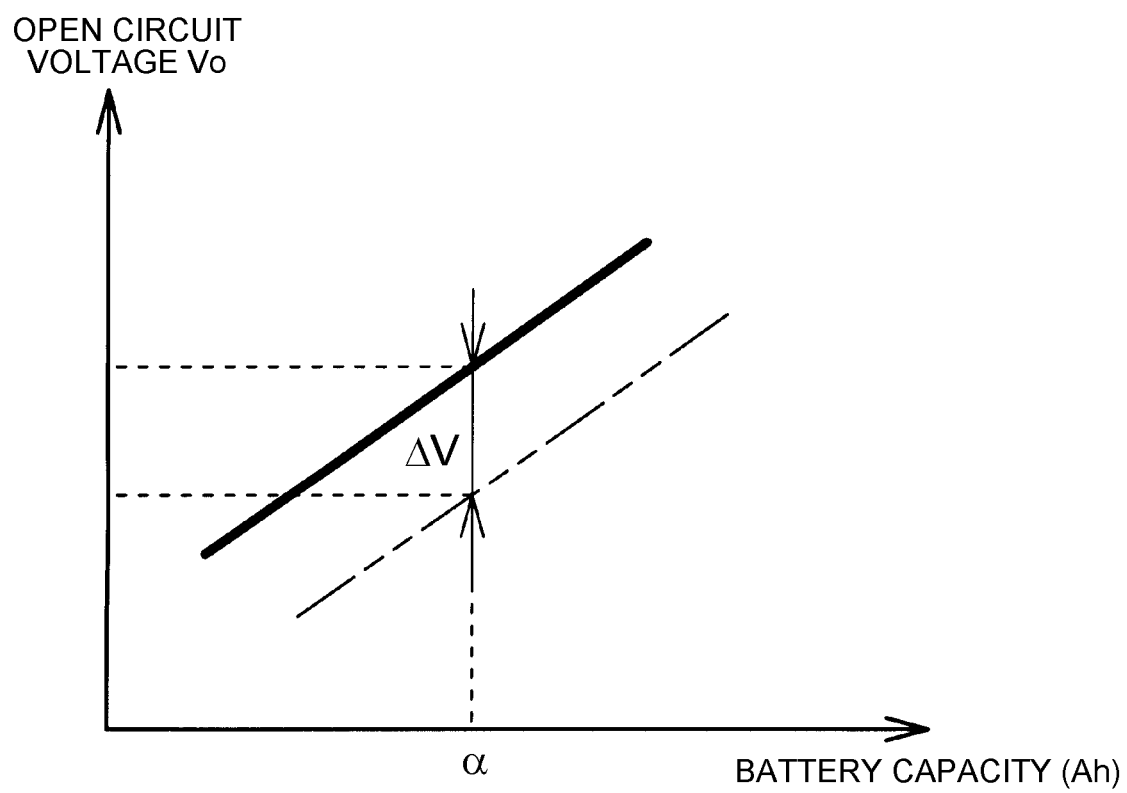
FIG. 17 is an explanatory diagram for a voltage error $\Delta V$.

After obtaining the open circuit voltage curve (measured value) and the open circuit voltage curve (estimated value), the control device 14 calculates a voltage error ΔV and a capacity error ΔQ between the open circuit voltage curve (measured value) and the open circuit voltage curve (estimated value) (S226). For example, the voltage error ΔV may be a voltage error ΔV at a particular battery capacity α, as shown in FIG. 17, or may be a mean-square value or the like of the voltage error between the two open circuit voltage curves.

The capacity error ΔQ may be the absolute value of the difference between a measured capacity Q1 and an estimated capacity Q2, that is, ΔQ=|Q1−Q2|. As the measured capacity Q1, the integrated current value $\Delta Ah_{12}$ acquired by the parameter acquisition routine can be used. As the estimated capacity Q2, the capacity change amount at the time of the change from the first open circuit voltage value Vo1 to the second open circuit voltage value Vo2 in the open circuit voltage curve (estimated value) can be used.

After obtaining the voltage error ΔV and the capacity error ΔQ, the control device 14, subsequently, calculates an evaluation function f(ΔV, ΔQ) for the voltage error ΔV and the capacity error ΔQ (S228). As the evaluation function f(ΔV, ΔQ), for example, a value resulting from weighting and adding the voltage error ΔV and the capacity error ΔQ can be used.

Further, the control device 14 determines whether the calculated evaluation function f(ΔV, ΔQ) in question is smaller than an evaluation function f(ΔV, ΔQ) stored in the memory 28. When the evaluation function f(ΔV, ΔQ) in question is smaller than the evaluation function f(ΔV, ΔQ) stored in the memory 28, the control device 14 stores the evaluation function f(ΔV, ΔQ) in question, in the memory 28, together with the deterioration parameters ($k_1$, $k_2$, $\Delta Q_s$) in question. When the evaluation function f(ΔV, ΔQ) in question is larger than the evaluation function f(ΔV, ΔQ) stored in the memory 28, the evaluation function f(ΔV, ΔQ) stored in the memory 28 is held with no change.

In step S230, the control device 14 determines whether the deterioration parameters have been changed in the whole search range (S230). When the deterioration parameters have not been changed in the whole search range, the control device 14 changes the candidate values of the deterioration parameters ($k_1$, $k_2$, $\Delta Q_s$) (S229), and returns to step S224.

On the other hand, when the deterioration parameters have been changed in the whole search range, the control device 14 ends the search. At this time, the deterioration parameters ($k_1$, $k_2$, $\Delta Q_s$) that minimize the evaluation function f(ΔV, ΔQ) in the search range are stored in the memory 28. It can be said that the deterioration parameters ($k_1$, $k_2$, $\Delta Q_s$) stored in the memory 28 are parameters indicating the deteriorated state of the battery 12 at the current time. The control device 14 estimates the SOC-OCV curve and the full charge capacity FCC based on the identified deterioration parameters ($k_1$, $k_2$, $\Delta Q_s$), and stores the estimated values in the memory 28 (S232).

Figure 10:
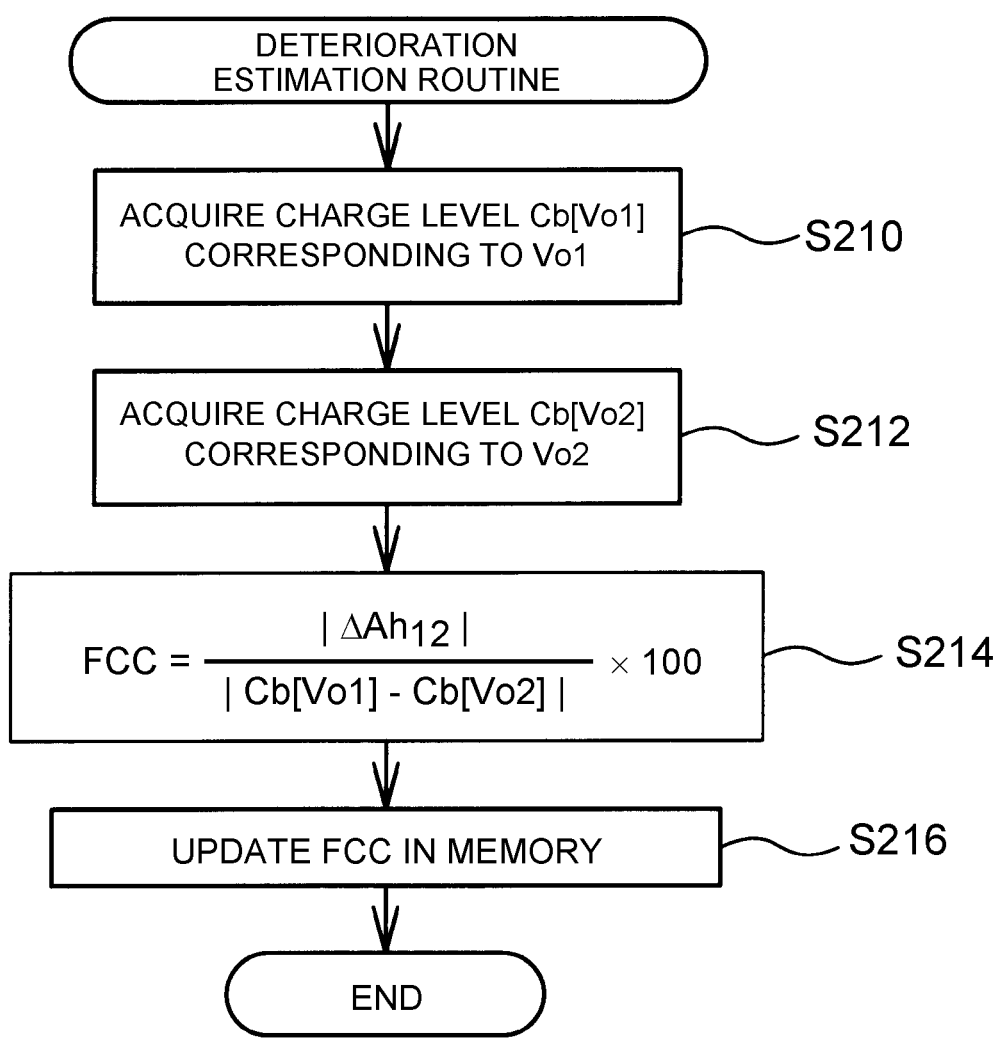
FIG. 10 is a flowchart showing an example of a deterioration estimation routine.

The deterioration estimation routines shown in FIG. 10 and FIG. 11 are examples, and another routine may be used as long as the deteriorated state of the battery 12 is estimated using the open circuit voltage values Vo1, Vo2 at a plurality of points and the integrated current value $\Delta Ah_{12}$ among the plurality of points.

As described above, the battery system 10 disclosed in the present specification estimates the aging deterioration, using the parameters (Vo1, Vo2, $\Delta Ah_{12}$) acquired in the non-hysteresis region. Thereby, it is possible to exactly estimate the deterioration of the battery 12 with no influence of the hysteresis. Incidentally, for estimating the deterioration of the battery 12 more exactly, it is desirable that the acquisition interval of the parameters, that is, the interval between the first open circuit voltage value Vo1 and the second open circuit voltage value Vo2 be as large as possible. Accordingly, if possible, it is desirable that the first and second open circuit voltage values Vo1, Vo2 be acquired near the upper limit and lower limit of the hysteresis region.

Figure 18:
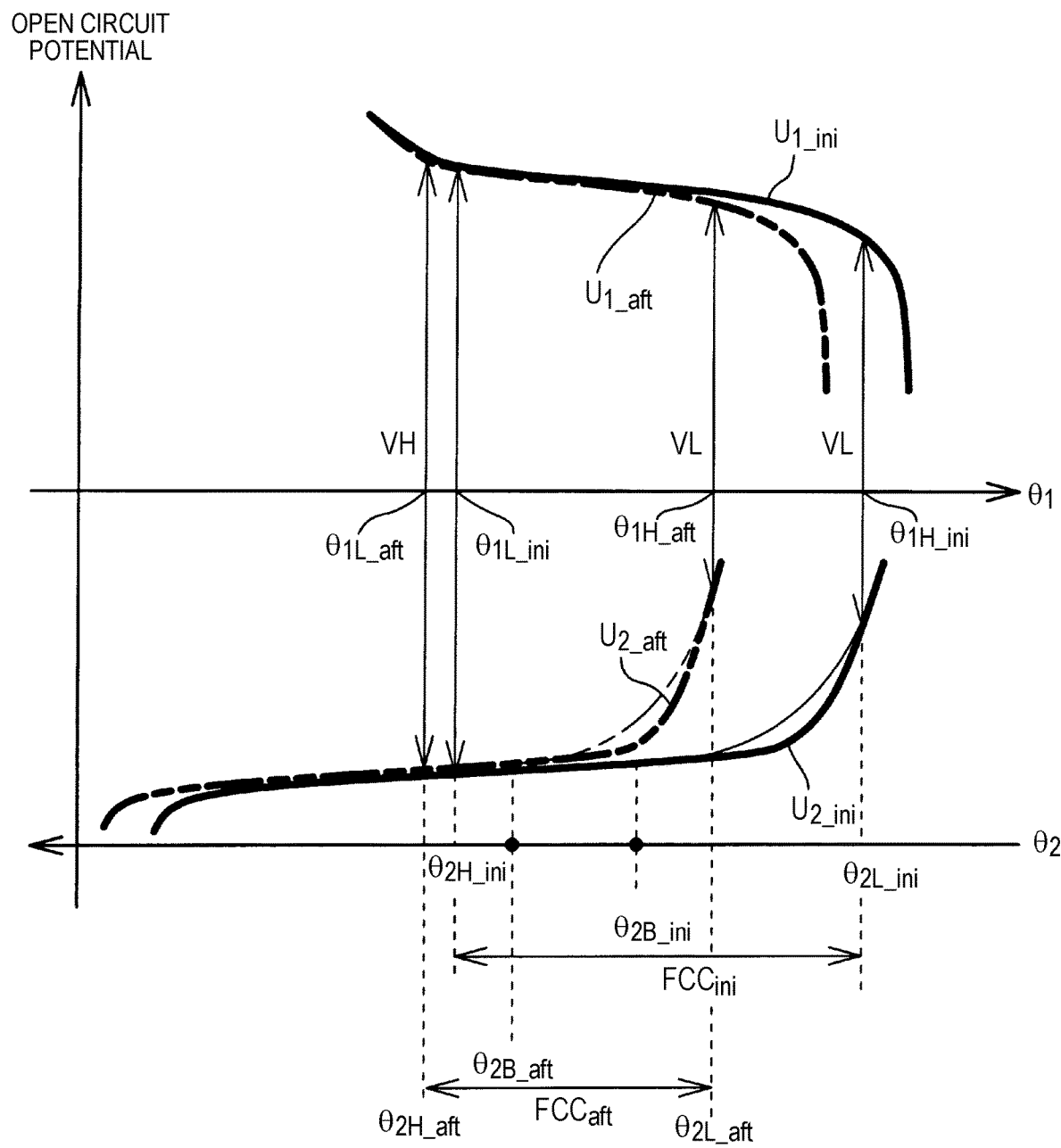
FIG. 18 is a diagram for describing a change in hysteresis appearance point associated with the deterioration of the lithium ion secondary battery.

However, the range of the non-hysteresis increases or decreases with the aging deterioration of the battery 12. This will be described with reference to FIG. 18. In FIG. 18, negative electrode open circuit potentials $U_{2\_ini}$, $U_{2\_aft}$ shown by thick lines indicate negative electrode open circuit potentials after the continuous charge of the battery, and negative electrode open circuit potentials $U_{2\_ini}$, $U_{2\_aft}$ shown by thin lines indicate negative electrode open circuit potentials after the continuous discharge. Further, a local charge level $\theta_{2B}$ at which the difference between the negative electrode open circuit potential (thick line) after the continuous charge and the negative electrode open circuit potential (thin line) after the continuous discharge becomes a certain amount or more of difference is referred to as a "hysteresis appearance point $\theta_{2B}$".

As already described, the open circuit voltage value Vo of the battery 12 is a difference value between the positive electrode open circuit potential and the negative electrode open circuit potential. Generally, the charge level Cb when the open circuit voltage value Vo of the battery 12 is a prescribed limit upper VH is 100%, and the charge level Cb when the open circuit voltage value Vo is a prescribed lower limit VL is 0%. The full charge capacity FCC is a positive electrode capacity or negative electrode capacity that is obtained when the open circuit voltage value Vo changes from Vo=VL to Vo=VH.

Suppose that, with the aging deterioration of the battery 12, the negative electrode open circuit potential changes from the negative electrode open circuit potential $U_{2\_ini}$ in the initial state to the negative electrode open circuit potential $U_{2\_aft}$ after the deterioration, as shown in FIG. 18. In this case, it is found that the position of the hysteresis appearance point $\theta_{2B}$ in the range of $\theta_{2L}$ to $\theta_{2H}$ (Cb=0% to Cb=100%), that is, in the full charge capacity FCC, differs between the initial state and the deteriorated state. This means that the non-hysteresis region changes due to the deterioration.

Thus, the actual non-hysteresis region increases or decreases with the aging deterioration of the battery 12. Here, in the parameter acquisition routine, the respective parameters Vo1, Vo2, $\Delta Ah_{12}$ are acquired in the non-hysteresis region stored in the memory 28. When there is a deviation between the non-hysteresis region stored in the memory 28 and the actual non-hysteresis region, the parameters can be actually acquired in the hysteresis region. Certainly, this problem can be avoided by predicting the real change in the non-hysteresis region associated with the deterioration and setting the non-hysteresis region stored in the memory 28 from the beginning. However, in this case, the acquisition range of the parameters sometimes narrows, and the opportunity of the acquisition of the parameters decreases.

Hence, in each deterioration estimation process for the battery 12, the range of the non-hysteresis region may be estimated and updated. Specifically, the negative electrode open circuit potential $U_{2\_aft}$ after the deterioration is evaluated using the deterioration parameters ($k_1$, $k_2$, $\Delta Q_s$) acquired in the deterioration estimation routine shown in FIG. 11. Thereby, it is possible to identify the position of a hysteresis appearance point $\theta_{2B}$ or $\theta_{1B}$, and further the value of the border charge level Cb_b at the border between the non-hysteresis region and the hysteresis region. Specifically, the border charge level Cb_b is expressed by the following Formula (11) and Formula (12), using $\theta_1$ and $\theta_2$.

$$Cb\_b = (\theta_{2B} - \theta_{2L})/(\theta_{2H} - \theta_{2L}) \tag{11}$$

$$Cb\_b = (\theta_{1H} - \theta_{2B})/(\theta_{1H} - \theta_{1L}) \tag{11}$$

The control device 14 updates the non-hysteresis region by storing the identified non-hysteresis region specified by the border charge level Cb_b in the memory 28 as a new non-hysteresis region. By estimating and updating the non-hysteresis region at the current time in each aging deterioration estimation in this way, it is possible to acquire the first and second open circuit voltage values Vo1, Vo2 and the integrated current value $\Delta Ah_{12}$, at an appropriate timing (charge level). As a result, it is possible to further enhance the estimation accuracy for the aging deterioration of the battery 12, and to obtain the opportunity of the estimation more surely.

In Formula (11) and Formula (12), the border charge level Cb_b is estimated from the local charge level $\theta_1$ or $\theta_2$. However, the SOC-OCV curve may be evaluated from the positive and negative open circuit potentials after the deterioration, and the border charge level Cb_b may be evaluated from the SOC-OCV curve.

Figure 19:
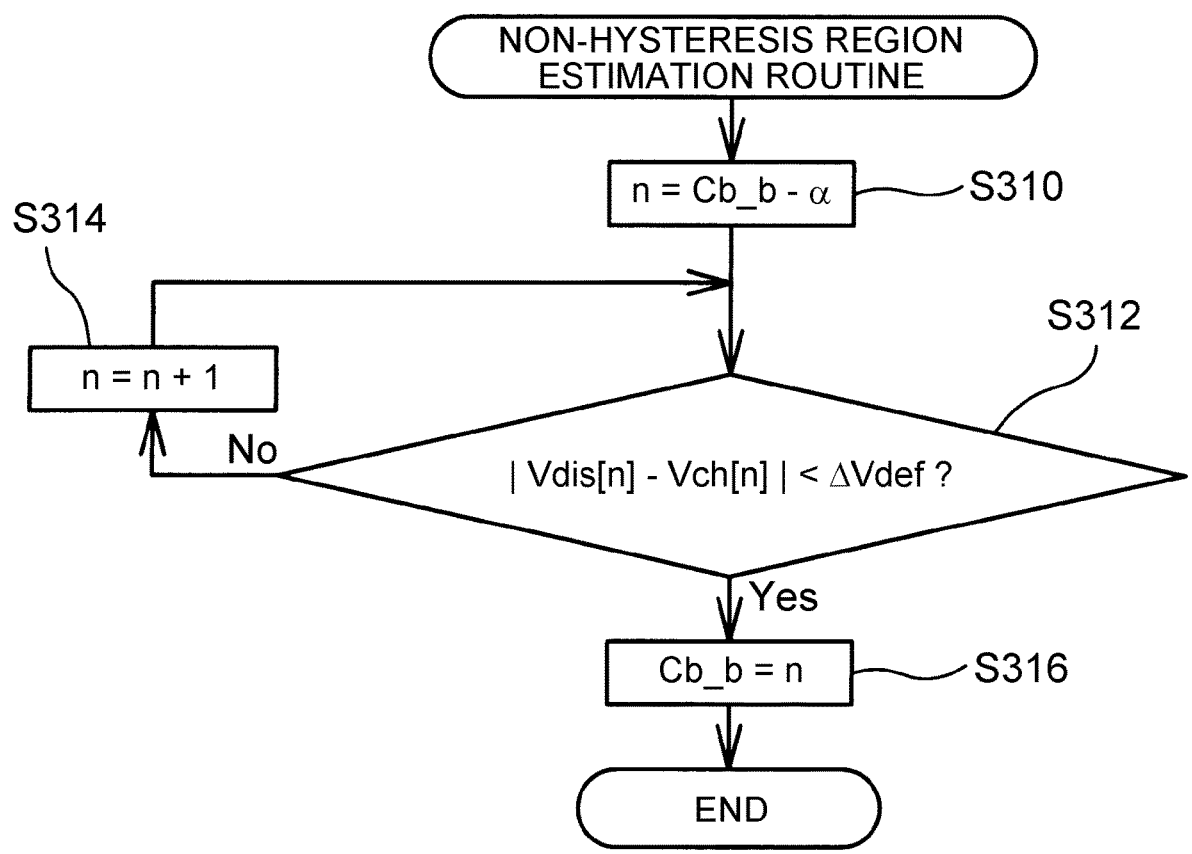
FIG. 19 is a flowchart showing an example of a non-hysteresis region estimation routine.

FIG. 19 is a flowchart showing an example of a non-hysteresis region estimation routine. The non-hysteresis region estimation routine in FIG. 19 is premised on the execution after the deterioration estimation routine shown in FIG. 11. Accordingly, the non-hysteresis region estimation routine is on the premise that the SOC-OCV curve after the aging deterioration of the battery 12 (the SOC-OCV curve at the current time), that is, OCV_dis and OCV_ch after the deterioration have been obtained.

When Vdis[n] is a voltage indicated by OCV_dis at the charge level Cb=n, Vch[n] is a voltage indicated by OCV_ch at the charge level Cb=n and $\Delta$Vdef is a prescribed threshold value, the control device 14 searches the value of n that satisfies (|Vdis[n]−Vch[n]|<$\Delta$Vdef), while sequentially changing the value of the charge level Cb=n (S312, S314). The initial value for the search may be a value resulting from subtracting a predetermined margin a from the border charge level Cb_b obtained at the time of the last estimation of the non-hysteresis region (S310). Whether the border charge level Cb_b increases or decreases after the deterioration depends on the characteristic of the battery. Accordingly, whether to set the predetermined margin a to a positive value or a negative value may be determined depending on the characteristic of the battery. The initial value of the search is not limited to this, and may be another value, for example, a predetermined fixed value. When the value n that satisfies (|Vdis[n]−Vch[n]|<$\Delta$Vdef) is found as a result of the search, the value n is stored in the memory 28 as a new border charge level Cb_b (S316).

As is obvious from the above description, the battery system 10 disclosed in the present specification acquires the parameters necessary for the aging deterioration estimation of the battery 12, in the non-hysteresis region. As a result, it is possible to estimate the aging deterioration of the battery 12 exactly and easily, with no influence of the hysteresis. As long as the parameters necessary for the aging deterioration estimation are acquired in the non-hysteresis region, other constituents may be appropriately modified.

For example, in the above description, only the open circuit voltage values Vo1, Vo2 at two points and the integrated current value $\Delta Ah_{12}$ between the two points are acquired as parameters to be used for the aging deterioration estimation. However, open circuit voltage values Vo at more points and integrated current values $\Delta$Ah among the more points may be acquired as long as the parameters are in the non-hysteresis region.

The present specification exemplifies the battery 12 having the negative electrode active material that contains a silicon material and graphite. However, the technology disclosed in the present specification may be applied to another kind of secondary battery, as long as the secondary battery partially has a significant hysteresis. For example, the technology disclosed in the present specification may be applied to a lithium ion secondary battery having a negative electrode active material that contains a silicon material and lithium titanate. In the case of the lithium ion secondary battery that contains a silicon material and lithium titanate, it is known that a hysteresis appears in a high-SOC region. Accordingly, in the case of using such a lithium ion secondary battery, it is only necessary to set the non-hysteresis region to a low-SOC region and use parameters Vo, $\Delta$Ah acquired in the low-SOC region (non-hysteresis region) for estimating the aging deterioration of the battery. Further, the technology disclosed in the present specification is not limited to the lithium ion secondary battery, and may be applied to another kind of secondary battery such as a nickel-hydrogen secondary battery.

The hysteresis of the SOC-OCV easily appears in a battery having an active material that contains a material with a great volume change (expansion or contraction). Examples of the negative electrode material include compounds alloying lithium, such as silicon compounds (Si, SiO and the like), tin compounds (Sn, SnO and the like), germanium compounds and lead compounds. Generally, the volume change of graphite to be used as the negative electrode material of the lithium ion battery is about 10%. The "material with a great volume change" causing the hysteresis of the SOC-OCV can be regarded, for example, as a material with a greater volume change than graphite (a material with a volume change greater than 10%).

Alternatively, a conversion material (for example, CoO, FeO, NiO, $Fe_2O_3$ or the like) exemplified in the following Formula (13) may be used as the negative electrode material. In Formula (13), M represents a transition metal, and X represents O, F, N, S or the like.

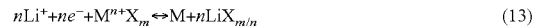

$$nLi^+ + ne^- + M^{n+}X_m \leftrightarrow M + nLiX_{m/n} \tag{13}$$

Further, a conversion material such as $FeF_3$ may be used in the positive electrode. The present specification exemplifies the case where the hysteresis of the SOC-OCV is caused by the negative electrode material. However, the technology disclosed in the present specification can be applied even in the case where the hysteresis is caused by the positive electrode material.

What is claimed is:

1. A battery system that is equipped in a vehicle, the battery system comprising:
   a battery configured to be charged and discharged, the battery being equipped in the vehicle, a charge level range of the battery including a hysteresis region and a non-hysteresis region, the hysteresis region being a charge level range where a significant hysteresis occurs, the significant hysteresis being hysteresis in which open-circuit voltage values with respect to a charge level of the battery after continuation of charging and after continuation of discharging are different from each other by a predetermined value or more, the non-hysteresis region being a charge level range where the significant hysteresis does not occur, a voltage detector configured to detect a voltage of the battery as a detected voltage value;

a current detector configured to detect a current flowing through the battery as a detected current value;

a charger configured to charge the battery while the vehicle is at a standstill; and an electronic control unit configured to control charge and discharge of the battery, the electronic control unit being configured to estimate an aging deterioration of the battery based on an open circuit voltage value that is calculated from the detected voltage value and an integrated current value that is calculated from the detected current value, and the electronic control unit being configured to:

estimate the aging deterioration of the battery based on the open circuit voltage value and the integrated current value that are calculated when the charge level of the battery is in the non-hysteresis region, wherein the open circuit voltage value includes a first open circuit voltage value and a second open circuit voltage value that are acquired in the non-hysteresis region, wherein the integrated current value is a value resulting from integrating the detected current value until the open circuit voltage value changes to the second open circuit voltage value after the open circuit voltage value becomes the first open circuit voltage value, and estimate, as a characteristic indicating the aging deterioration, at least one of a full charge capacity of the battery at a current time and a change characteristic of the open circuit voltage value with respect to the charge level, based on the first open circuit voltage value, the second open circuit voltage value and the integrated current value, temporarily stop charge of the battery with the charger when the charge level of the battery reaches a first charge level or a second charge level in the non-hysteresis region in a middle of the charge of the battery with the charger, and acquire the detected voltage value that is obtained during a charge stop period, as one of the first open circuit voltage value and the second open circuit voltage value.

2. The battery system according to claim 1, wherein the electronic control unit is configured to acquire two open circuit voltage values that are acquired at timings when the charge level of the battery is in the non-hysteresis region and the open circuit voltage values are acquirable, as the first open circuit voltage value and the second open circuit voltage value, during a power-on of the vehicle.

3. The battery system according to claim 1, wherein the electronic control unit is configured to control the charge and discharge of the battery such that the charge level of the battery transitions to the non-hysteresis region, and acquire the first open circuit voltage value, the second open circuit voltage value and the integrated current value, when an elapsed time from a last estimation of the aging deterioration is equal to or more than a prescribed reference time.

4. The battery system according to claim 1, wherein the electronic control unit is configured to:

estimate at least a change characteristic of the open circuit voltage value with respect to the charge level, as a characteristic indicating the aging deterioration;

estimate the charge level range that is the non-hysteresis region, based on the estimated change characteristic of the open circuit voltage value with respect to the charge level; and update the non-hysteresis region based on the estimated charge level range.

5. The battery system according to claim 4, wherein the electronic control unit is configured to update the charge level at a time of acquisition of the open circuit voltage value and the integrated current value that are used for one of the estimation of the aging deterioration and a range of the charge level, along with the update of the non-hysteresis region.

6. The battery system according to claim 1, wherein the battery is a lithium ion secondary battery having a negative electrode active material that contains at least a silicon material and graphite, and the charge level range of the non-hysteresis region is higher in the charge level than a charge level range of the hysteresis region.

7. The battery system according to claim 1, wherein the battery is a lithium ion secondary battery having a negative electrode active material that contains at least a silicon material and lithium titanate, and the charge level range of the non-hysteresis region is higher in the charge level than a charge level range of the hysteresis region.

8. An aging deterioration estimation method for a battery system, a charge level range of the battery including a hysteresis region and a non-hysteresis region, the hysteresis region being a charge level range where a significant hysteresis occurs, the significant hysteresis being hysteresis in which open-circuit voltage values with respect to a charge level of the battery after continuation of charging and after continuation of discharging are different from each other by a predetermined value or more, the non-hysteresis region being a charge level range of the battery where the significant hysteresis does not occur, the battery system including an electronic control unit and a charger configured to charge the battery while the vehicle is at a standstill, the aging deterioration estimation method comprising:

acquiring, by the electronic control unit, parameters from which open circuit voltage values at two points and an integrated current value between the two points are calculated when the charge level of the battery is in the non-hysteresis region; and estimating, by the electronic control unit, an aging deterioration of the battery based on the acquired open circuit voltage values and the acquired integrated current value, wherein the open circuit voltage value includes a first open circuit voltage value and a second open circuit voltage value that are acquired in the non-hysteresis region, wherein the integrated current value is a value resulting from integrating the detected current value until the open circuit voltage value changes to the second open circuit voltage value after the open circuit voltage value becomes the first open circuit voltage value, and estimating as a characteristic indicating the aging deterioration, at least one of a full charge capacity of the battery at a current time and a change characteristic of the open circuit voltage value with respect to the charge level, based on the first open circuit voltage value, the second open circuit voltage value and the integrated current value, temporarily stopping charge of the battery with the charger when the charge level of the battery reaches a first charge level or a second charge level in the non-hysteresis region in a middle of the charge of the battery with the charger, and acquiring the detected voltage value that is obtained during a charge stop period, as one of the first open circuit voltage value and the second open circuit voltage value.

* * * * *